(12) United States Patent
Cai et al.

(10) Patent No.: US 10,622,357 B2
(45) Date of Patent: Apr. 14, 2020

(54) FINFET INCLUDING TUNABLE FIN HEIGHT AND TUNABLE FIN WIDTH RATIO

(71) Applicants: International Business Machines Corporation, Armonk, NY (US); GlobalFoundries, Inc., Grand Cayman (KY); STMicroelectronics, Inc., Coppell, TX (US)

(72) Inventors: Xiuyu Cai, Niskayuna, NY (US); Qing Liu, Watervliet, NY (US); Ruilong Xie, Schenectady, NY (US); Chun-Chen Yeh, Danbury, CT (US)

(73) Assignees: INTERNATIONAL BUSINESS MACHINES CORPORATION, Armonk, NY (US); GLOBALFOUNDRIES, INC. (KY); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 16/294,117

(22) Filed: Mar. 6, 2019

(65) Prior Publication Data
US 2019/0206868 A1 Jul. 4, 2019

Related U.S. Application Data

(60) Continuation of application No. 15/168,382, filed on May 31, 2016, now Pat. No. 10,276,573, which is a
(Continued)

(51) Int. Cl.
*H01L 27/092* (2006.01)
*H01L 21/033* (2006.01)
(Continued)

(52) U.S. Cl.
CPC ...... *H01L 27/0924* (2013.01); *H01L 21/0338* (2013.01); *H01L 21/3086* (2013.01);
(Continued)

(58) Field of Classification Search
CPC ............. H01L 27/1211; H01L 27/0886; H01L 27/0924; H01L 21/823431; H01L 21/845;
(Continued)

(56) References Cited

U.S. PATENT DOCUMENTS

| 6,909,147 B2 | 6/2005 | Aller et al. |
| 7,244,654 B2 | 7/2007 | Chidambaram et al. |

(Continued)

OTHER PUBLICATIONS

List of IBM Patents or Patent Applications Treated as Related; (Appendix P), Filed Jun. 5, 2019; 2 pages.

*Primary Examiner* — Jose R Diaz
(74) *Attorney, Agent, or Firm* — Cantor Colburn LLP; Vazken Alexanian

(57) ABSTRACT

A semiconductor substrate includes a bulk substrate layer that extends along a first axis to define a width and a second axis perpendicular to the first axis to define a height. A plurality of hetero semiconductor fins includes an epitaxial material formed on a first region of the bulk substrate layer. A plurality of non-hetero semiconductor fins is formed on a second region of the bulk substrate layer different from the first region. The non-hetero semiconductor fins are integrally formed from the bulk substrate layer such that the material of the non-hetero semiconductor fins is different from the epitaxial material.

20 Claims, 27 Drawing Sheets

Related U.S. Application Data division of application No. 14/583,842, filed on Dec. 29, 2014, now Pat. No. 9,887,196.

(60) Provisional application No. 61/976,008, filed on Apr. 7, 2014.

(51) Int. Cl.

| | |
|---|---|
| *H01L 21/8238* | (2006.01) |
| *H01L 29/16* | (2006.01) |
| *H01L 29/78* | (2006.01) |
| *H01L 29/06* | (2006.01) |
| *H01L 21/308* | (2006.01) |
| *H01L 21/84* | (2006.01) |
| *H01L 27/12* | (2006.01) |
| *H01L 29/10* | (2006.01) |
| *H01L 29/165* | (2006.01) |

(52) U.S. Cl.
CPC .. *H01L 21/3088* (2013.01); *H01L 21/823807* (2013.01); *H01L 21/823821* (2013.01); *H01L 21/845* (2013.01); *H01L 27/0922* (2013.01); *H01L 27/1211* (2013.01); *H01L 29/0684* (2013.01); *H01L 29/1054* (2013.01); *H01L 29/16* (2013.01); *H01L 29/165* (2013.01); *H01L 29/7849* (2013.01)

(58) Field of Classification Search
CPC .......... H01L 21/02532; H01L 29/7831; H01L 29/785

See application file for complete search history.

(56) References Cited

U.S. PATENT DOCUMENTS

| | | | |
|---|---|---|---|
| 7,301,210 | B2 | 11/2007 | Abadeer et al. |
| 7,544,994 | B2 | 6/2009 | Schepis et al. |
| 7,560,785 | B2 | 7/2009 | Yu et al. |
| 7,612,405 | B2 | 11/2009 | Yu et al. |
| 7,638,843 | B2 | 12/2009 | Xiong et al. |
| 7,709,303 | B2 | 5/2010 | Burnett et al. |
| 8,106,459 | B2 | 1/2012 | Chang et al. |
| 9,356,046 | B2 | 5/2016 | Cheng et al. |
| 9,887,196 | B2 * | 2/2018 | Cai ..................... H01L 27/0922 |
| 10,276,573 | B2 * | 4/2019 | Cai ..................... H01L 27/0922 |
| 2006/0081556 | A1 | 4/2006 | Cline et al. |
| 2008/0128797 | A1 | 6/2008 | Dyer et al. |
| 2011/0133292 | A1 | 6/2011 | Lee |
| 2011/0210393 | A1 | 9/2011 | Chen et al. |
| 2013/0005114 | A1 | 1/2013 | Maszara |
| 2013/0224936 | A1 | 8/2013 | Lee |
| 2014/0197456 | A1 | 7/2014 | Wang |
| 2014/0353767 | A1 | 12/2014 | Liu |
| 2015/0028454 | A1 | 1/2015 | Cheng |
| 2016/0218218 | A1 | 7/2016 | Zhu |

\* cited by examiner

FINFET INCLUDING TUNABLE FIN HEIGHT AND TUNABLE FIN WIDTH RATIO

DOMESTIC PRIORITY

This application is a continuation of U.S. patent application Ser. No. 15/168,382, filed on May 31, 2016, which is a divisional of U.S. patent application Ser. No. 14/583,842, filed Dec. 29, 2014, now U.S. Pat. No. 9,887,196, issued Feb. 6, 2018, which is a non-provisional of U.S. Provisional Application Ser. No. 61/976,008, filed Apr. 7, 2014, the disclosures of which are incorporated by reference herein in their entireties.

BACKGROUND

The present invention relates to complimentary metal oxide semiconductor (CMOS) devices, and more specifically, to CMOS devices including a PFET having a hetero channel.

Conventional CMOS devices typically include one or more pairs of complementary and symmetrical p-type field effect transistors (pFETs) and n-type field effect transistors (nFETs) for providing high noise immunity and low static power consumption. CMOS devices utilizing semiconductor devices including one or more semiconductor fins (i.e., FinFETs) can realize an improvement in device performance. Adjusting the fin height and/or fin width may also control current output provided by the FinFET. Forming one or more hetero fins (e.g., fins formed from silicon germanium on a silicon substrate) corresponding to a p-type FinFET results in higher hole mobility through the fin due to the light hole effective mass. However, fabricating CMOS devices including both hetero channels and non-hetero channels require additional masking and etching processes that result in an overall complex and expensive fabrication process.

SUMMARY

According to at least one embodiment, a method of fabricating a semiconductor device comprises forming a semiconductor substrate that extends along a first axis to define a width and a second axis perpendicular to the first axis to define a height. The semiconductor substrate includes a bulk substrate layer and a hardmask layer formed on the bulk substrate layer. A plurality of oxide elements and high-k elements are formed on the hardmask layer. The plurality of oxide elements and high-k elements are arranged in an alternating series that extends along the width and between opposing ends of the semiconductor substrate. The method further comprises removing a first portion of the oxide elements located in a first region of the semiconductor substrate such that a cavity is formed between pairs of high-k elements while maintaining a second portion of the oxide elements located in a second region of the semiconductor substrate. The method further includes extending a depth of each cavity to form a plurality of extended cavities in the bulk substrate layer. The method further includes growing an epitaxial material on portions of semiconductor substrate exposed by the cavities to form hetero semiconductor channels having a first width in the first region.

According to another exemplary embodiment, a semiconductor substrate includes a bulk substrate layer that extends along a first axis to define a width and a second axis perpendicular to the first axis to define a height. A plurality of hetero semiconductor fins includes an epitaxial material formed on a first region of the bulk substrate layer. A plurality of non-hetero semiconductor fins is formed on a second region of the bulk substrate layer different from the first region. The non-hetero semiconductor fins are integrally formed from the bulk substrate layer such that the material of the non-hetero semiconductor fins is different from the epitaxial material.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Figure 1:
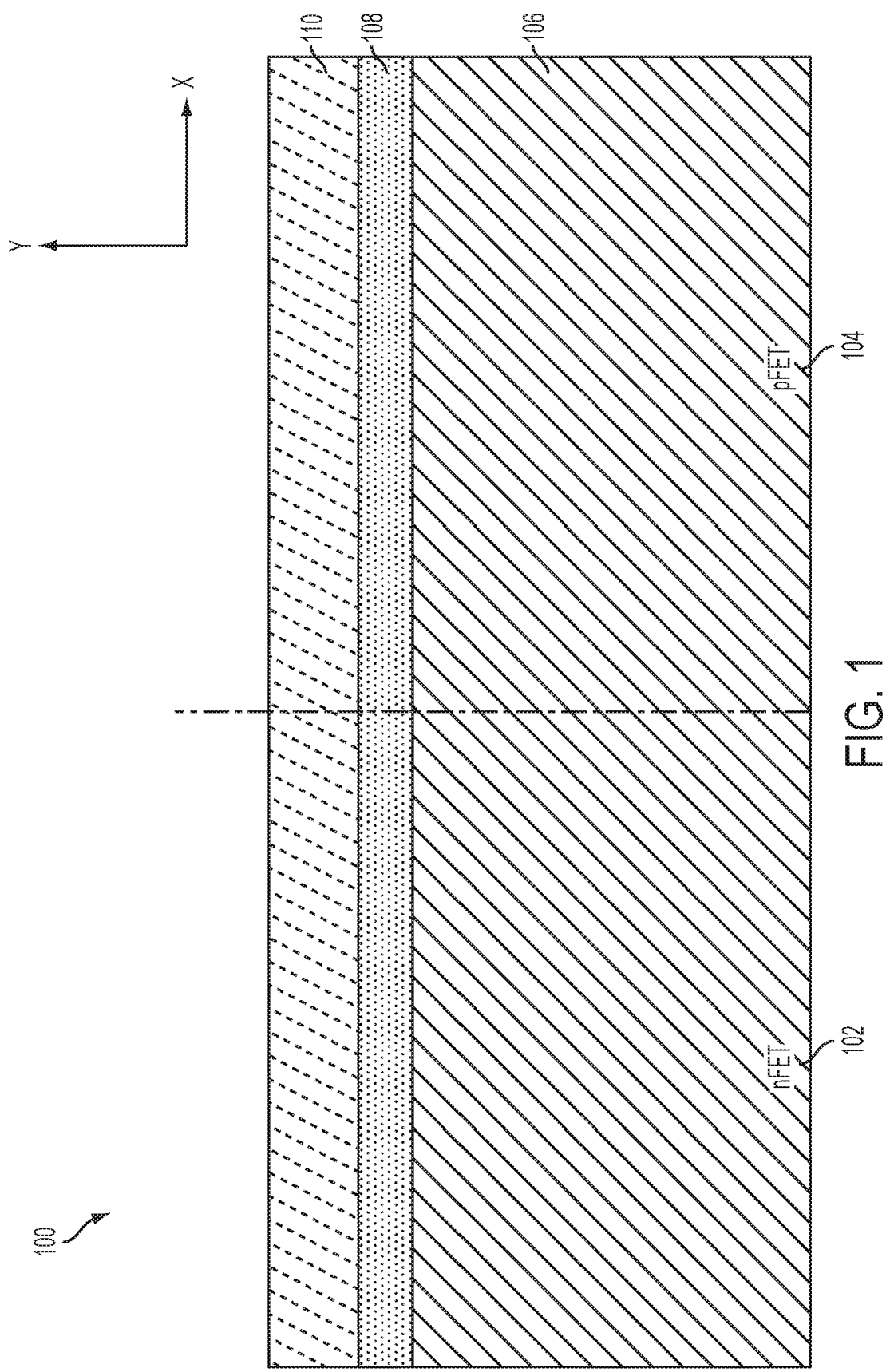
FIG. 1 illustrates a starting semiconductor substrate including a hardmask layer interposed between an oxide layer and a bulk substrate layer.

With reference now to FIG. 1, a starting semiconductor substrate 100 having one or more nFET regions 102 and one or more pFET regions 104 is generally indicated. The semiconductor substrate 100 may extend along a first axis (e.g., X-axis) to define a width, and a second axis (e.g., Y-axis) perpendicular to the X-axis to define a height. Although not illustrated in FIG. 1, it is appreciated that the semiconductor device may also extend along a third axis (e.g., Z-axis) to define a length.

The starting substrate 100 includes a bulk substrate layer 106, a hardmask layer 108, and a first sacrificial layer 110. The bulk substrate layer 106 may be formed from various semiconductor materials such as, for example, silicon. The hardmask layer 108 is formed on an upper surface of the bulk substrate layer 106. The hardmask layer 108 may be formed from various materials including, but not limited to, silicon nitride (SiN). The first oxide layer 110 may be comprise oxide, for example, to form a first oxide layer 110. The first oxide layer 110 is formed on an upper surface of the hardmask layer 106. Accordingly, the hardmask layer 108 is interposed between the bulk substrate layer 106 and the first oxide layer 110. The first oxide layer 110 may be formed from, for example, silicon oxide ($SiO_2$). Although the semiconductor substrate 100 is illustrated as a bulk substrate, it is appreciated that the semiconductor substrate 100 may be formed as a semiconductor-on-insulator (SOI) substrate as understood by those ordinarily skilled in the art.

Figure 2:
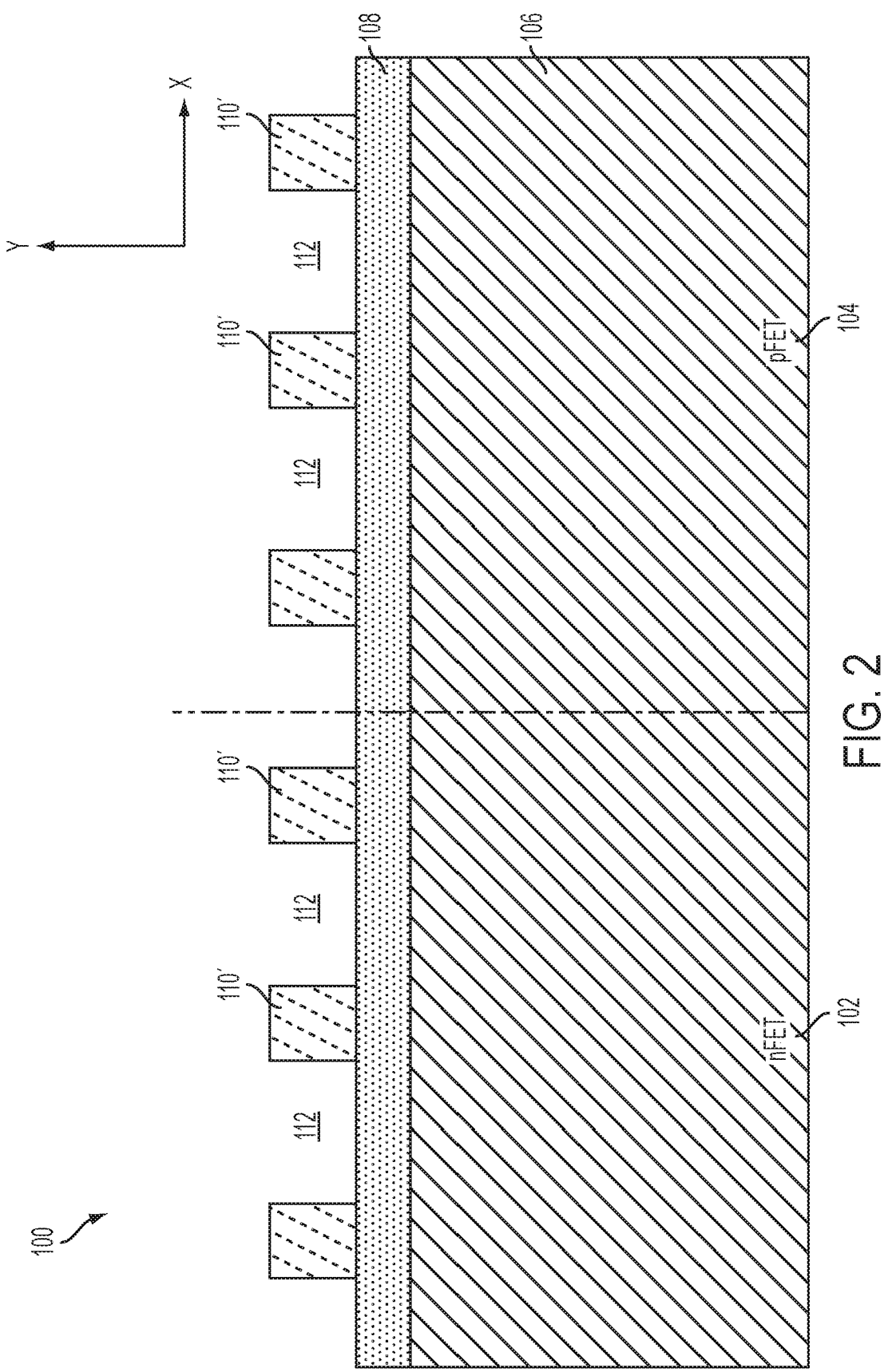
FIG. 2 illustrates the semiconductor substrate of FIG. 1 following a patterning process that forms a plurality of trenches in the oxide layer.

Referring to FIG. 2, the first oxide layer 110 is patterned to form a plurality of oxide elements 110' separated from one another by a respective trench 112. A sidewall image transfer (SIT) process using a patterned masking layer formed on the first oxide layer 110 may be used to form the trenches 112 in the first oxide layer 108 as understood by those ordinarily skilled in art. Accordingly, the trenches 112 expose the underlying hardmask layer 108 between remaining portions of the first oxide elements 110'.

Figure 3:
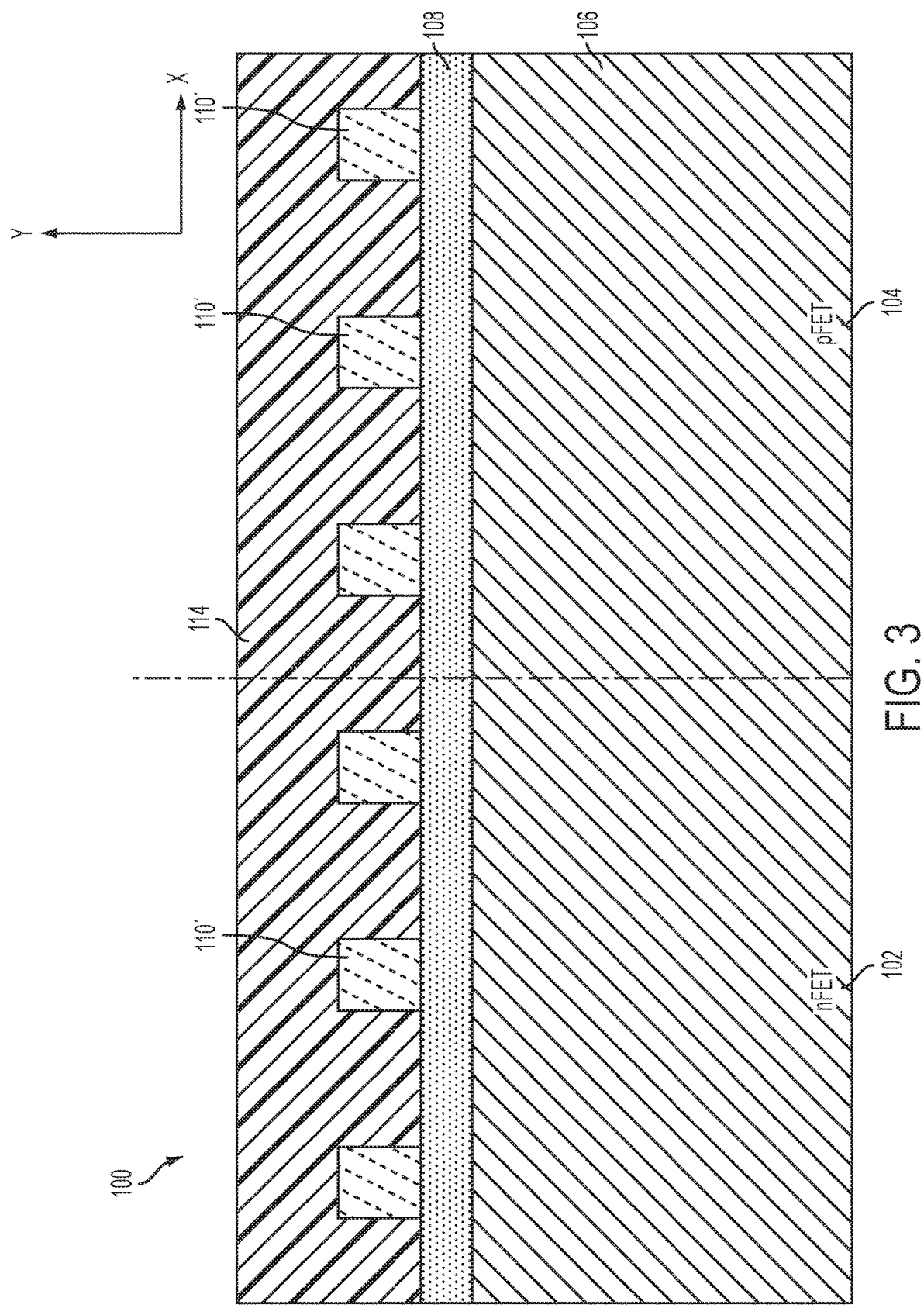
FIG. 3 illustrates the semiconductor substrate of FIG. 2 after depositing a high-k block layer on an upper surface of the hardmask layer to fill the trenches and cover the remaining portions of the oxide layer.

Referring to FIG. 3, the semiconductor substrate 100 is illustrated after depositing a second sacrificial layer 114 block layer 114 on an upper surface of the hardmask layer 108 to fill the trenches 112 and cover the first oxide elements 110'. The second sacrificial layer 114 may comprise various materials including, but not limited to, hafnium oxide ($HfO_2$) and aluminum oxide ($Al_2O_3$), to form a high-dialectic (high-k) block layer 114.

Figure 4:
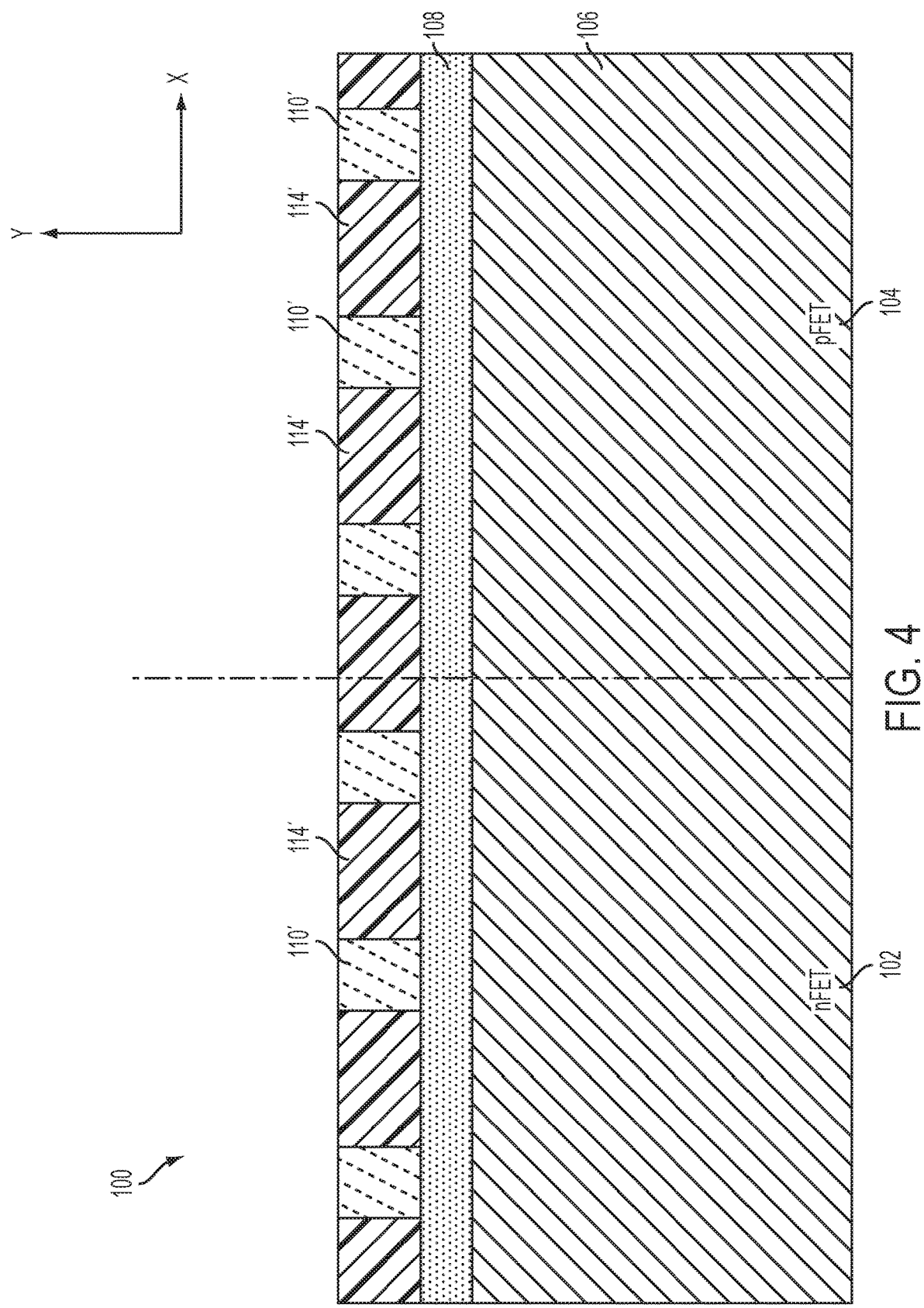
FIG. 4 illustrates the semiconductor substrate of FIG. 3, following a planarization process that recesses the high-k layer to be flush with an upper surface of the remaining portions of the oxide layer.

Referring to FIG. 4, the semiconductor substrate 100 is illustrated following a planarization process such as a chemical mechanical planarization (CMP) process, for example, that recesses the high-k layer 114. In this regard, a high-k element 114' is formed in a respective trench 112. Accordingly, each first dielectric element 110' is interposed between a pair of high-k elements 114'. The planarization process may stop on an upper surface of the first oxide elements 110'. In this regard, an upper surface of the high-k elements 114' is flush with an upper surface of the first oxide elements 110'.

Figure 5:
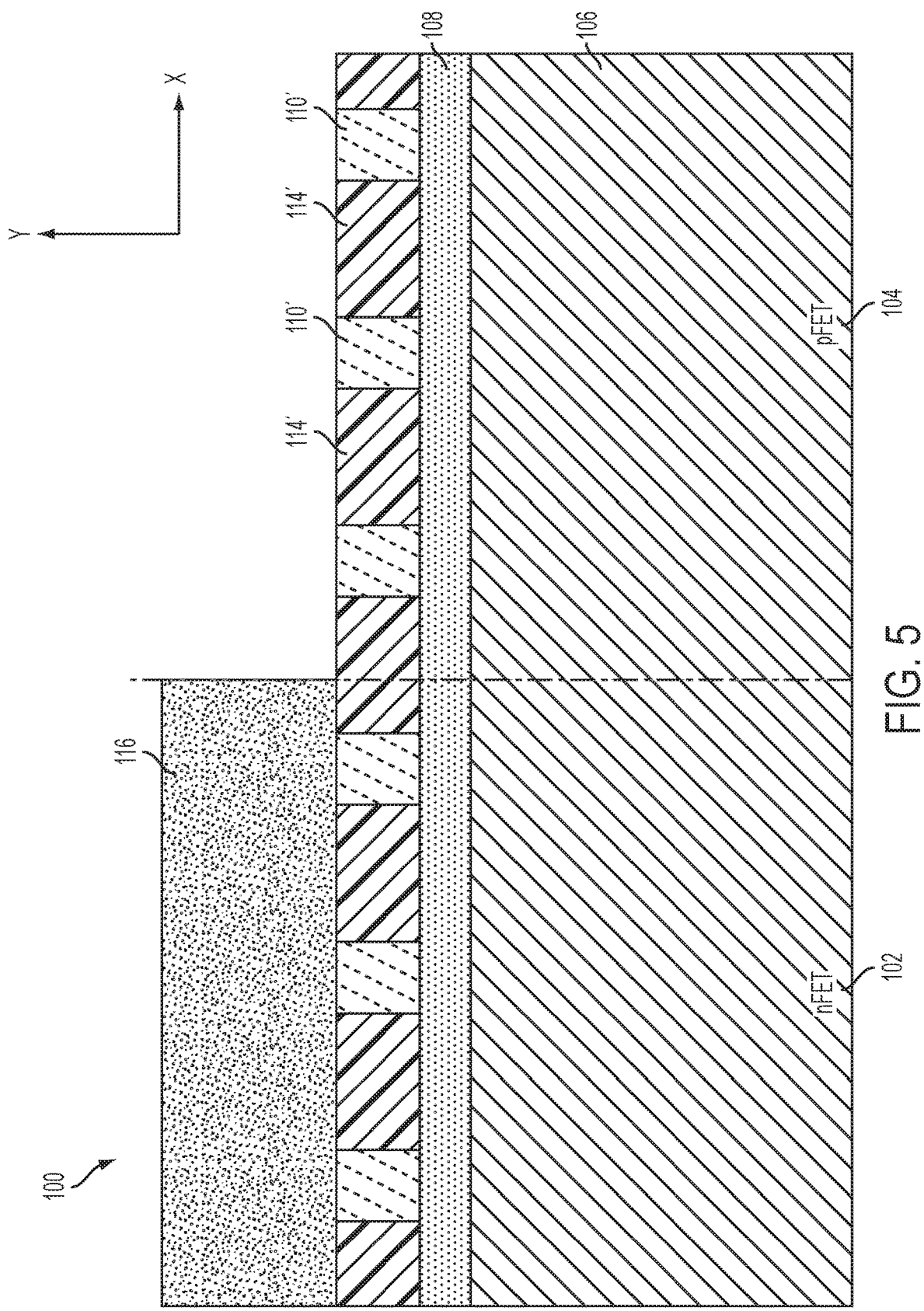
FIG. 5 illustrates the semiconductor substrate of FIG. 4 after patterning a masking layer formed on the upper surface of the semiconductor substrate to expose a pFET region.

Turning to FIG. 5, the semiconductor substrate 100 is illustrated after patterning a masking layer 116 formed on the upper surface of the semiconductor substrate 100. According to at least one exemplary embodiment, the masking layer 116 is patterned according to a lithography process. In this regard, the first oxide elements 110' and the high-k elements 114' corresponding to the pFET region 104 may be exposed while the first oxide elements 110' and the high-k elements 114' corresponding to the nFET region 102 remain covered. The masking layer 116 may comprise various materials including, but not limited to, a photoresist material and an optical planarization layer as understood by one of ordinary skill in the art.

Figure 6:
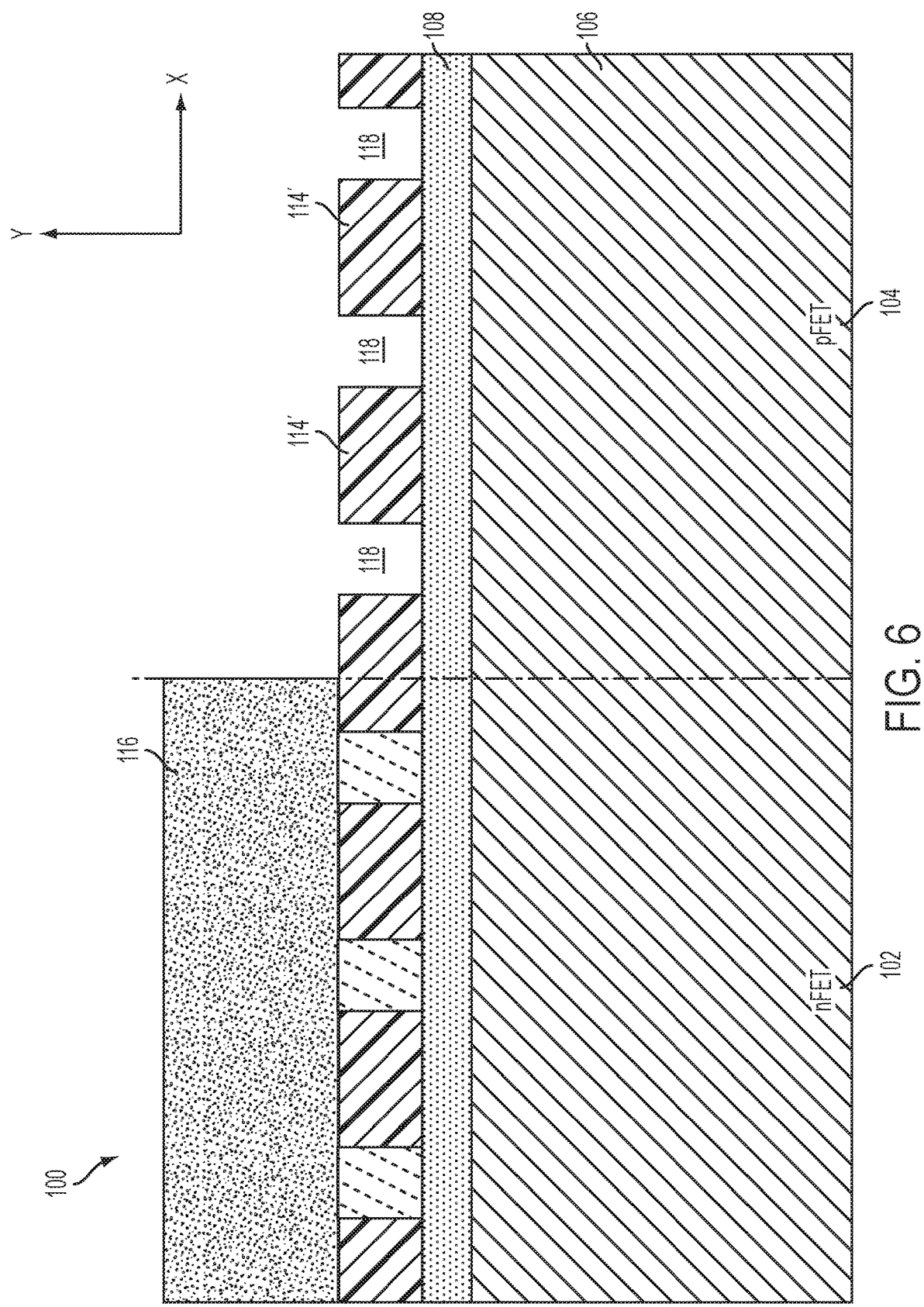
FIG. 6 illustrates the semiconductor substrate of FIG. 5 following removal of the remaining portions of the oxide layer from the pFET region to form respective cavities.

Referring to FIG. 6, the first oxide elements 110' are removed from the pFET region 104. Accordingly, cavities 118 that expose the underlying hardmask layer 108 are interposed between pairs of high-k elements 114'. The first oxide elements 110' corresponding to the pFET region may be removed using, for example, a vapor hydrogen fluoride (VHF) etching process that is selective to the high-k elements 114', the underlying hardmask layer 108 of the pFET region 104, and the remaining masking layer 116 of the nFET region 102.

Figure 7:
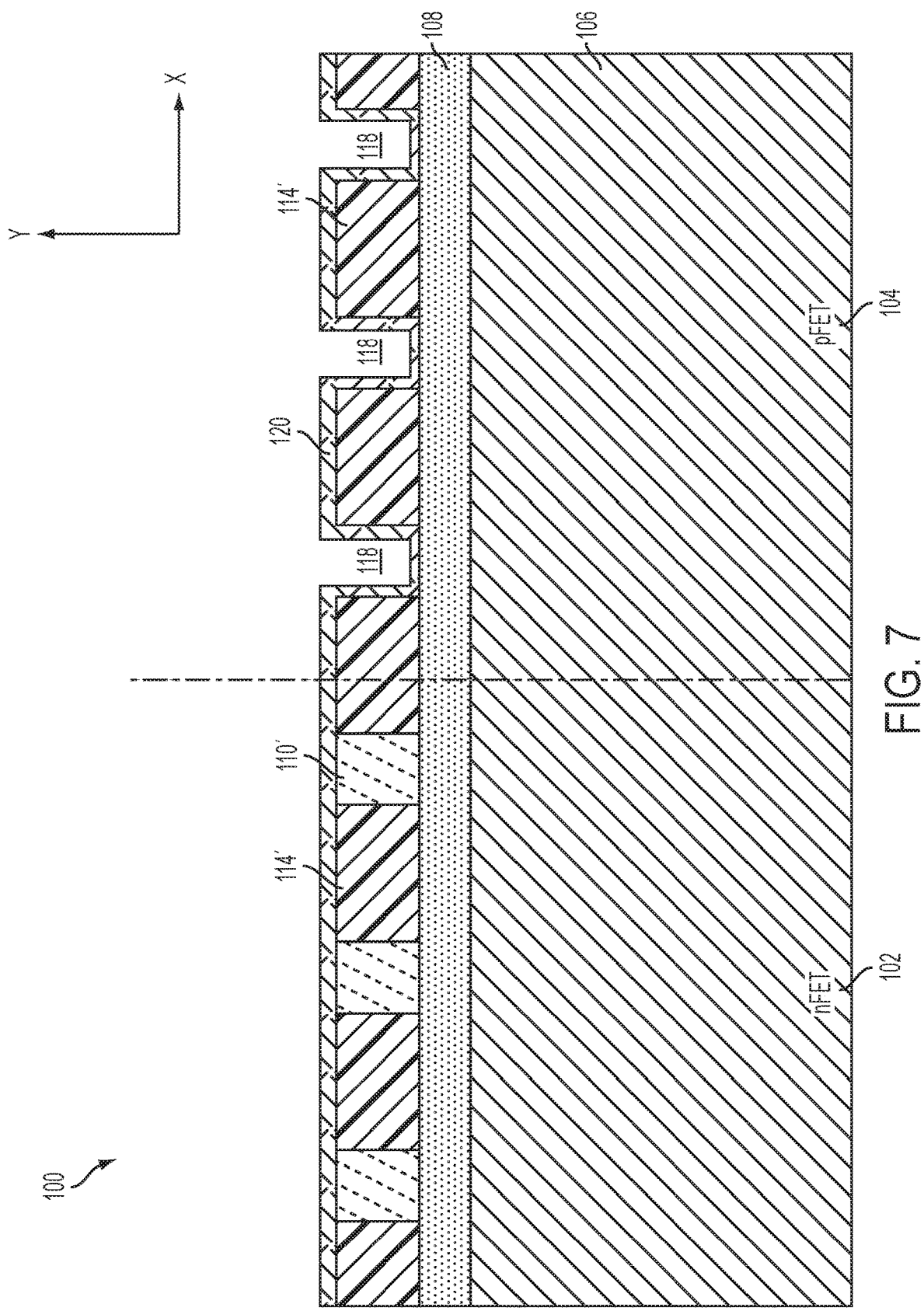
FIG. 7 illustrates the semiconductor substrate of FIG. 6 after removing the masking layer and following deposition of a conformal spacer layer on an upper surface of the semiconductor substrate.

Turning now to FIG. 7, the remaining portion of masking layer 116 is removed from the nFET region 102, and a conformal spacer layer 120 is deposited on an upper surface of the nFET region 102 and pFET region 104 of the semiconductor substrate 100. With respect to the nFET region 102, the conformal spacer layer 120 covers the upper surface of the high-k elements 114' and the first oxide elements 110'. With respect to the pFET region 104, the conformal spacer layer 120 is formed on the upper surface of the hardmask layer 108 exposed by the cavities 118, and the sidewalls and upper surface of the high-k elements 114'. The conformal spacer layer 120 may be formed from various materials including, but not limited to, SiN.

Figure 8:
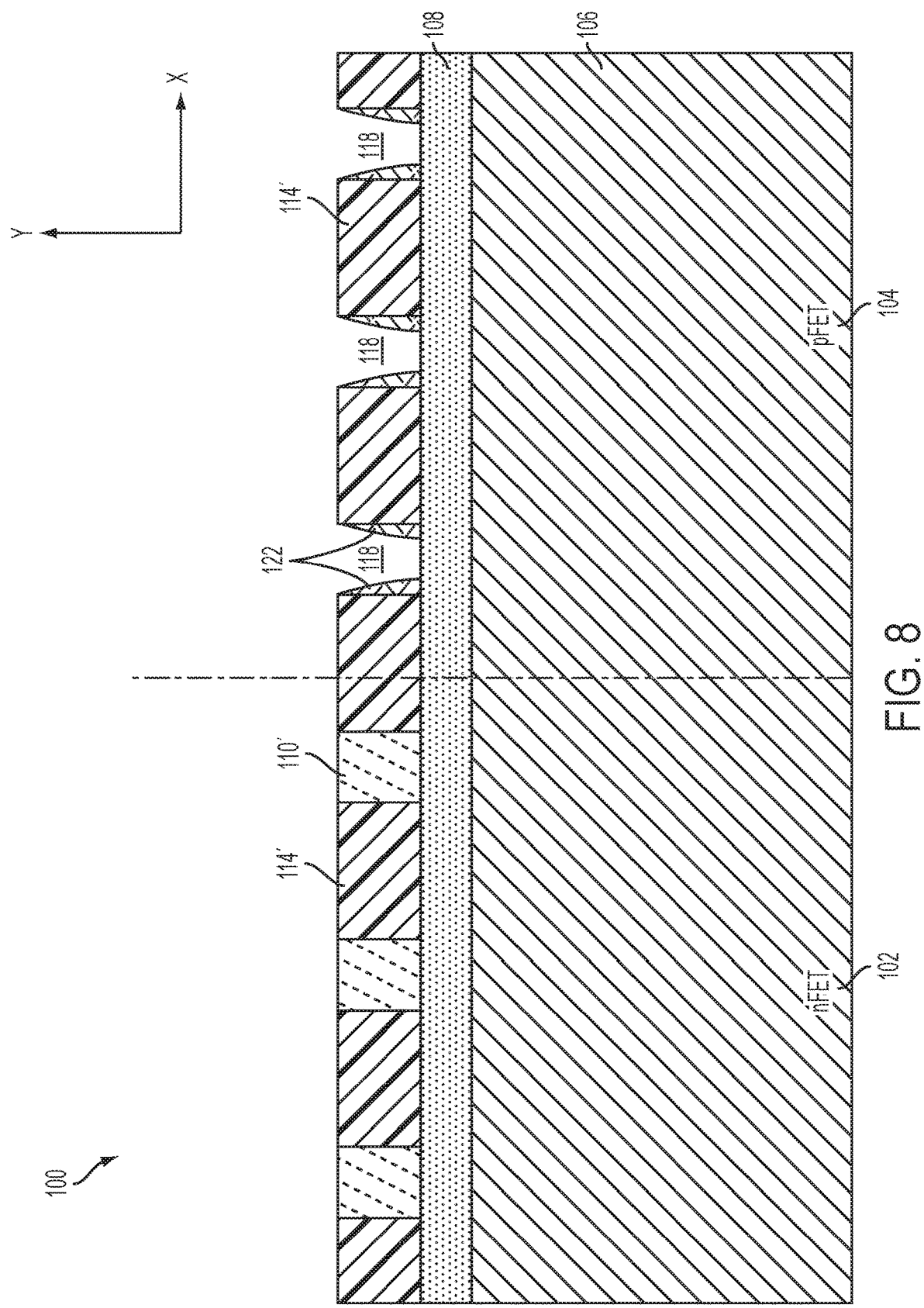
FIG. 8 illustrates the semiconductor substrate of FIG. 7 after etching the conformal spacer layer to form spacers on sidewalls of the cavities.

Referring to FIG. 8, the conformal spacer layer 120 is etched to form individual spacers 122 on the sidewalls of the high-k elements 114' exposed by the cavities 118 corresponding to the pFET region 104. A sidewall image transfer (SIT) process that is selective to both the material of the high-k elements 114' and the material of the first oxide elements 110' may be used. In this regard, the conformal spacer layer 120 is removed from the upper surfaces of the first oxide elements 110' and the high-k elements 114' of the nFET region 102. With respect to the pFET region 104, the conformal spacer layer 120 is removed from the upper surface of the high-k elements 114' and the upper surface of the hardmask layer 108. Accordingly, the spacers 122 are formed on the sidewalls of the high-k elements 114' exposed by the cavities 118.

Figure 9:
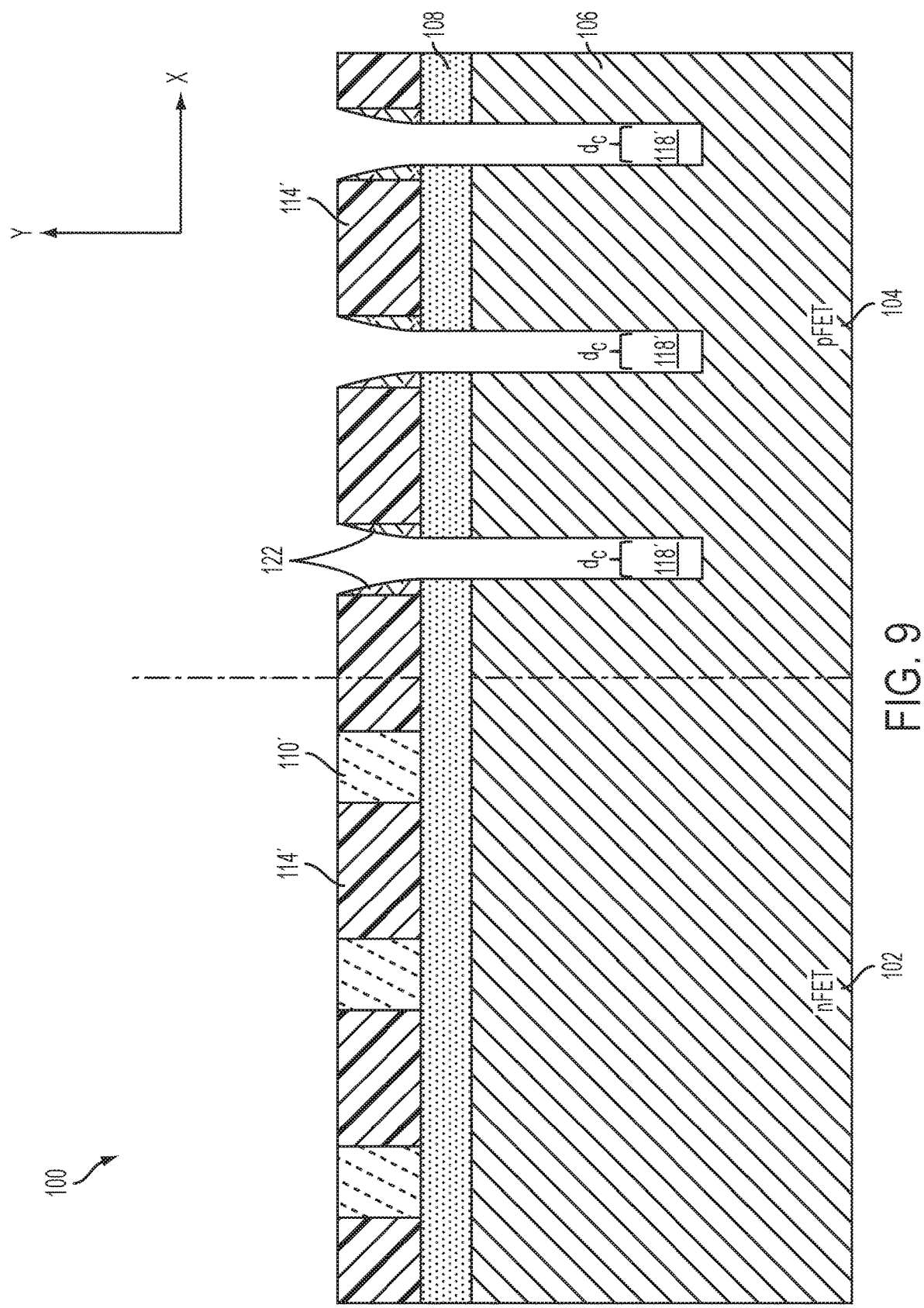
FIG. 9 illustrates the semiconductor substrate of FIG. 8 after extending the cavities into the bulk substrate layer.

Turning to FIG. 9, the depth of the cavities 118 is increased such that extended cavities 118' are formed through the hardmask layer 108 and into the bulk substrate layer 106. The width ($d_C$) of the extended cavities 118' may be controlled by the distance between a pair of spacers 122 corresponding to a respective extended cavity 118'. The extended cavities 118' may be formed using a two-step etching process. A first etching process may be used to etch the hardmask layer 108 and expose the underlying bulk substrate layer 106, and a second etching process may be used to etch bulk substrate layer 106 and extend the cavities 118' therethrough. The first etching process may include a dry etching process comprising carbon tetrafluoromethane ($CF_4$) with the addition of oxygen ($O_2$), for example. The added $O_2$ may induce oxidation at the surface of the bulk substrate layer 106 such that the decrease in the etch rate of bulk substrate occurs. Accordingly, the first etching process may etch the hardmask layer 108 while being selective to the underlying bulk substrate layer 106. The second etching process may include a dry etching process that consists of carbon tetrafluoromethane ($CF_4$), for example. Various other etching processes, however, may be used to extend the cavities 118' through the hardmask layer 108 and into the bulk substrate layer 106 as understood by those ordinarily skilled in the art.

Figure 10:
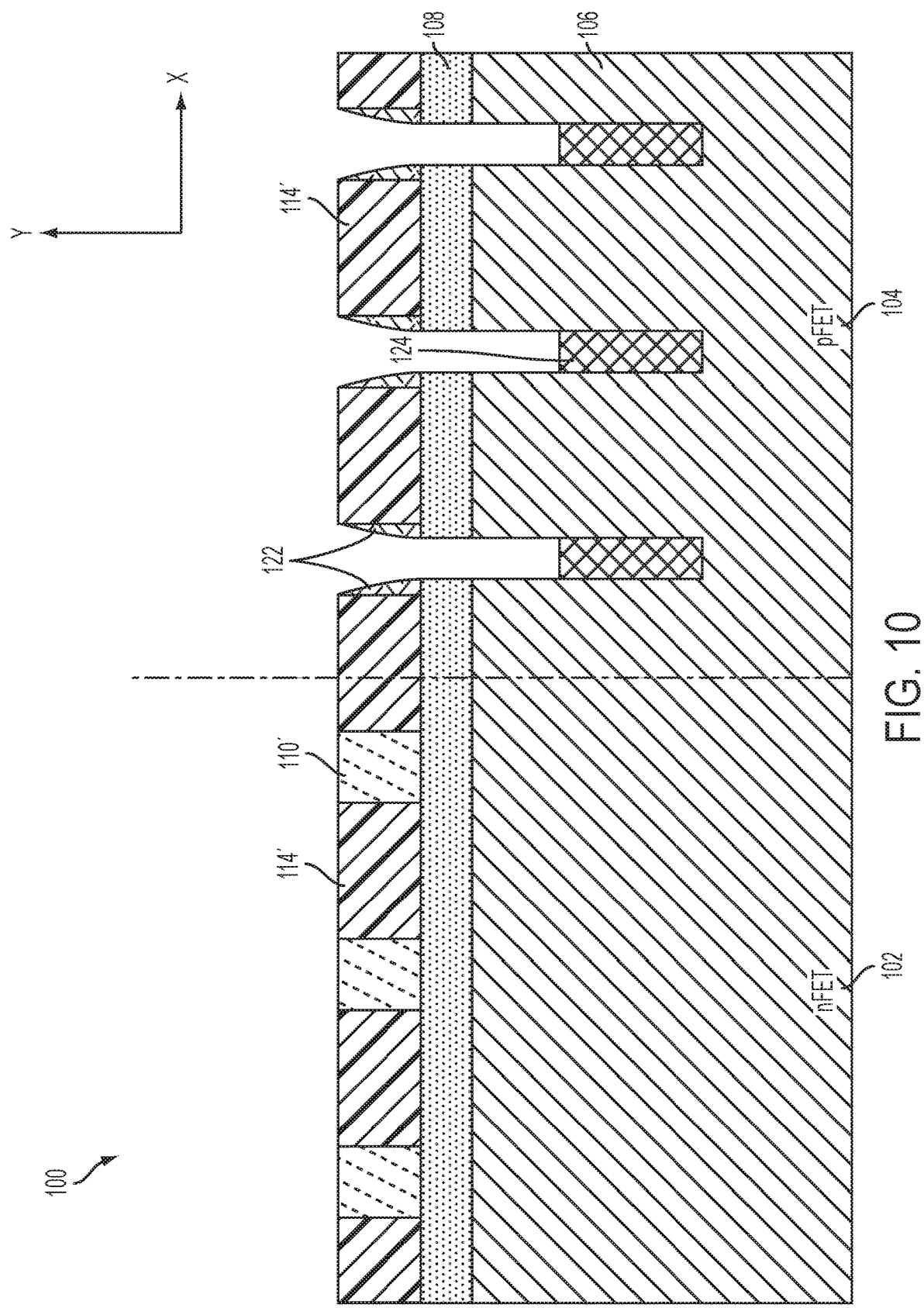
FIG. 10 illustrates the semiconductor substrate of FIG. 9 following an epitaxial growth process to grow epitaxial material in the extended cavities.

Turning now to FIG. 10, an epitaxial material (epi) 124 is grown on the surfaces of the bulk substrate layer 106 exposed by the extended cavities 118'. According to one exemplary embodiment, the epi 124 comprises silicon germanium (SiGe), which is grown from the exposed surfaces of the bulk substrate layer 106 and fills the cavities 118'. The epi 124 (e.g., SiGe) forms a respective hetero semiconductor element (i.e., hetero fin) corresponding to the pFET region 104 of the semiconductor device 100, as discussed in greater detail below. The width of the epi 124 (i.e., the hetero channel) is based on the width ($d_C$) of a respective extended cavity 118'. In addition, the height of the epi 124 may be controlled according to the amount epi 124 grown within the extended cavities 118'. Accordingly, a feature of adjusting a height of a hetero semiconductor fin may be provided is discussed in greater detail below.

Figure 11:
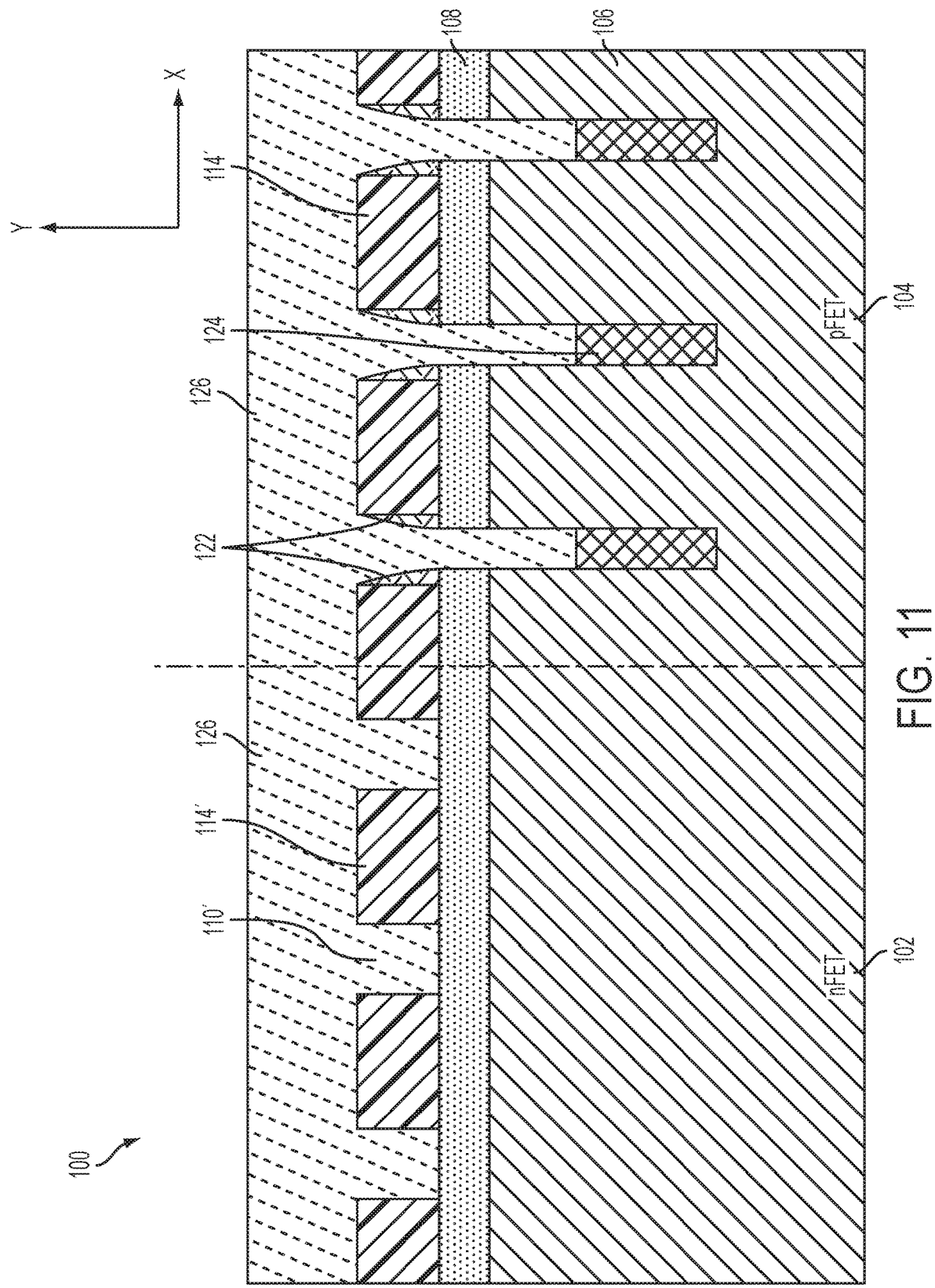
FIG. 11 illustrates the semiconductor substrate of FIG. 10 following deposition of a second oxide layer that fills the cavities and covers the epitaxial material.

Turning to FIG. 11, a third sacrificial layer 126 is deposited on the semiconductor device 100. The third sacrificial layer 126 may comprise of oxide, for example, to form a second oxide layer 126. With respect to the nFET region 102, the second oxide layer 126 is formed on an upper surface of the high-k elements 114' and the first oxide elements 110'. With respect to the pFET region 104, the second oxide layer 126 is formed on an upper surface of the high-k elements 114' and fills the extended cavities 118' to cover the epi 124. The second oxide layer 126 may be formed from various materials including, for example, $SiO_2$.

Figure 12:
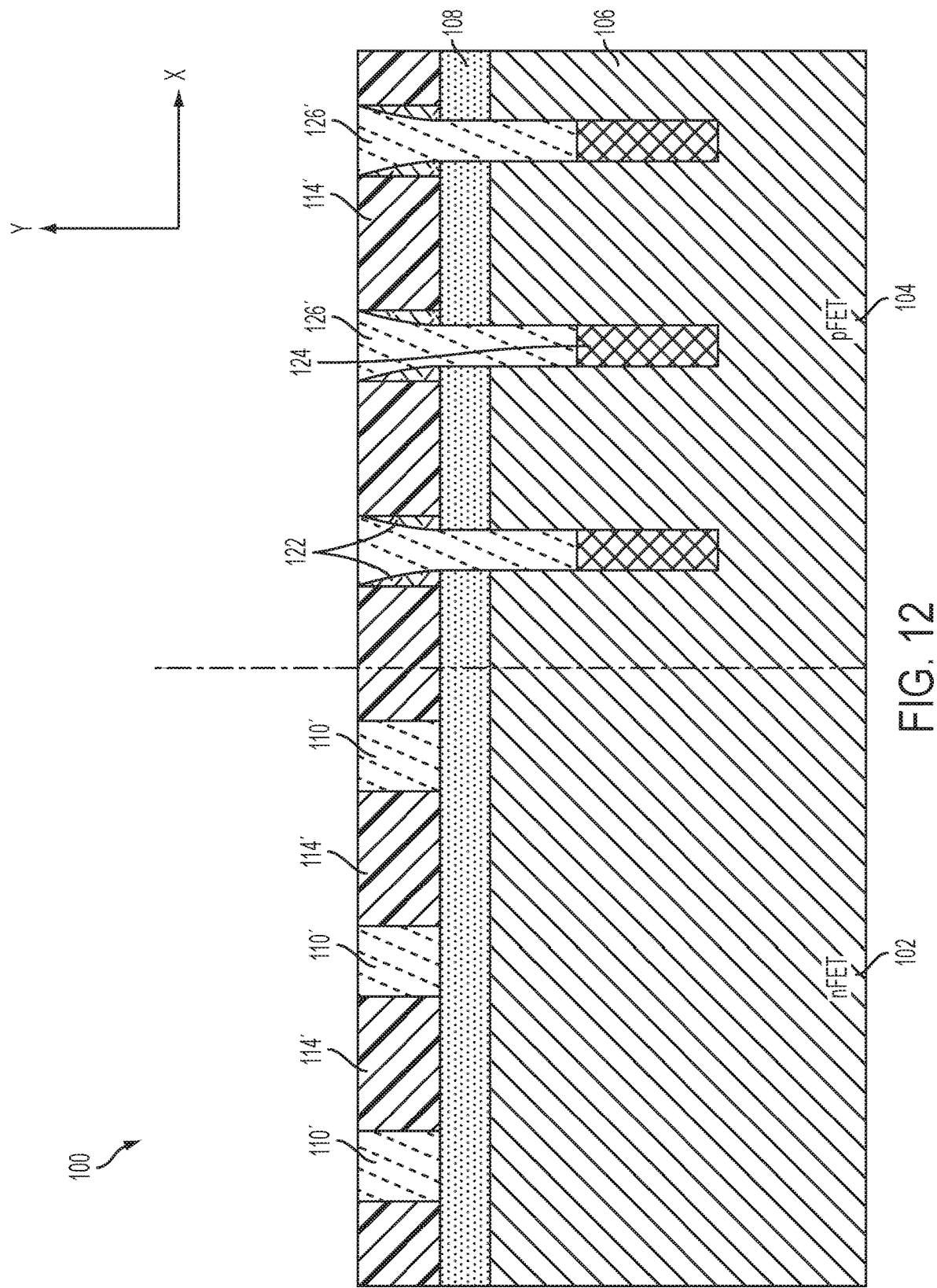
FIG. 12 illustrates the semiconductor substrate of FIG. 11 following a planarization process that recesses the second oxide layer to be flush with upper surfaces of the high-k elements.

Referring to FIG. 12, the second oxide layer 126 corresponding to the nFET region 102 and the pFET region 104 is recessed. Accordingly, second oxide elements 126' are formed between pairs of high-k elements 114'. A chemical mechanical planarization (CMP) process may recess the second oxide layer 126 while stopping on upper surfaces of the high-k elements 114'. With respect to the pFET region 104, an upper surface of the second oxide layer 126 that fills a respective cavity 118' is flush with an upper surface of the high-k elements 114'.

Figure 13:
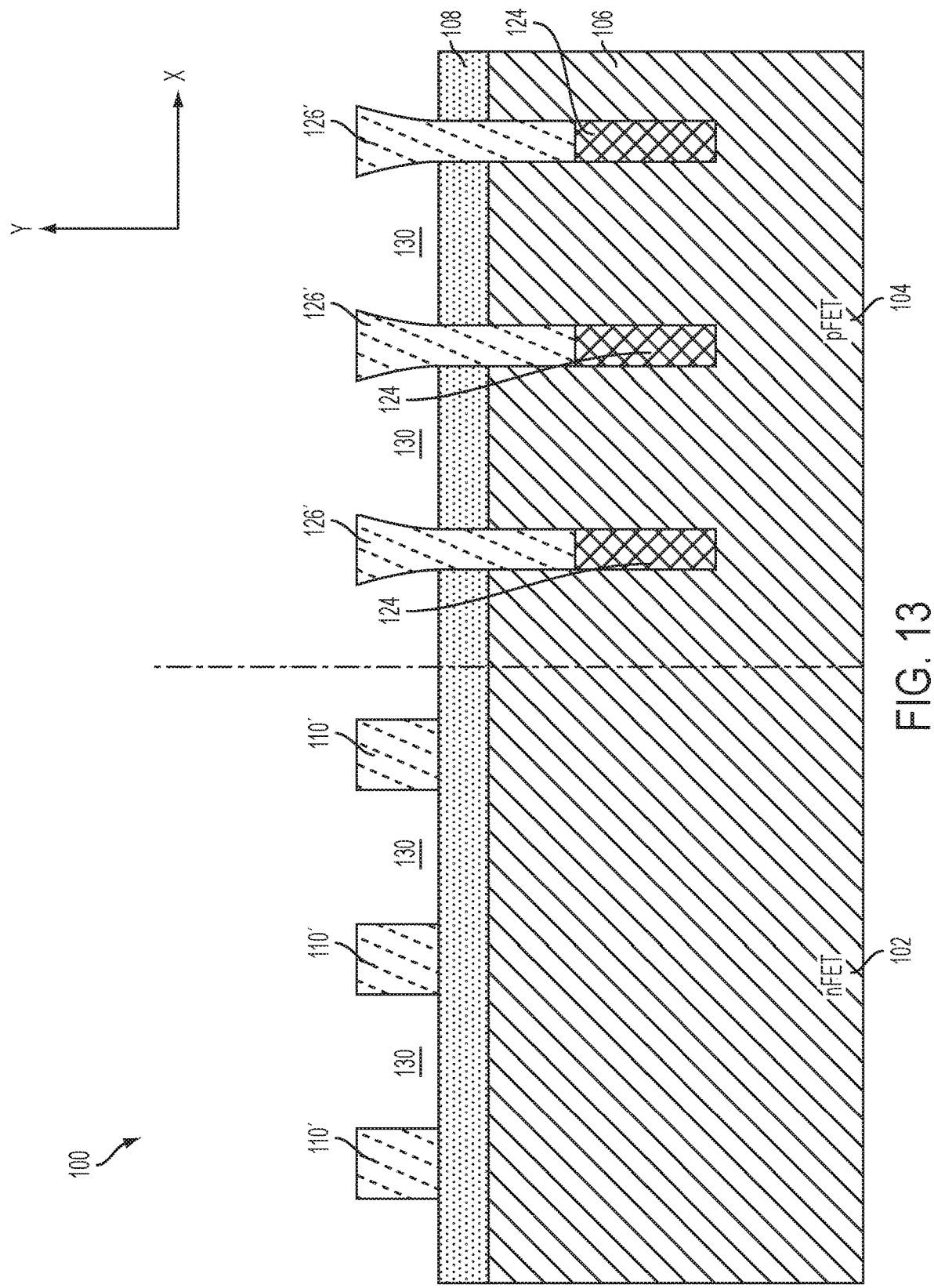
FIG. 13 illustrates the semiconductor substrate of FIG. 12 following removal of the high-k elements from the upper surface of the semiconductor substrate to form a plurality of voids.

Turning now to FIG. 13, the high-k elements 114' corresponding to the nFET region 102 and the pFET 104 are removed. Accordingly, voids 130 are formed between pairs of first oxide elements 110' corresponding to the nFET region 102 and also between pairs of second oxide elements 126' corresponding to the pFET region 104. Various etching process may be used to remove the high-k elements 114'. For example, a wet etching process comprising a combination of hydrochloric acid (HCl) and sulfuric acid ($H_2SO_4$) may etch away the high-k elements 114' while being selective to the first oxide elements 110' corresponding to the nFET region 102, second oxide elements 126' corresponding to the pFET region 104 and the hardmask layer 108. A second spacer etching process may be performed to remove the previously formed spacers 122. A portion of the hardmask layer 108 may also be etched when removing the spacers 122. The second spacer etching process may include, for example, a dry etching process that is selective to the second oxide elements 126'. The second spacer etching process may be time-etched to control the amount of hardmask layer 108 that is etched.

Figure 14:
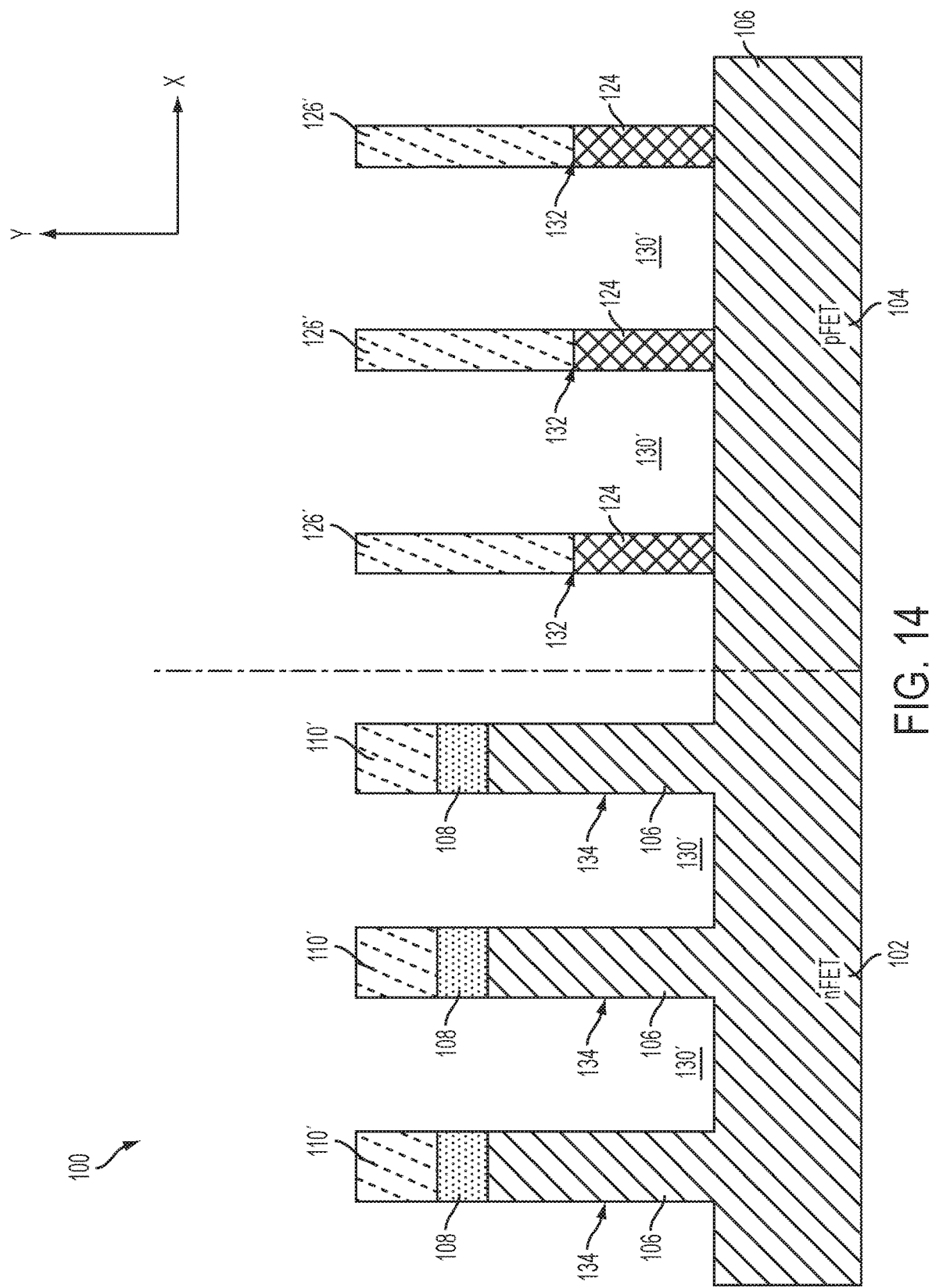
FIG. 14 illustrates the semiconductor substrate of FIG. 13 following an etching process that extends the voids into the bulk substrate layer to form a plurality of non-hetero fins at the nFET region and a plurality of hetero fins at the pFET region.

Referring to FIG. 14, the depth of each previously formed void 130 is increased such that extended voids 130' are formed through the hardmask layer 108 and into the bulk substrate layer 106. The extended voids 130' may be formed using a two-step etching process. A first etching process may be used to etch the hardmask layer 108 and expose the underlying bulk substrate layer 106, and a second etching process may be used to etch bulk substrate layer 106 and extend the voids 130' therethrough. The first etching process may include a dry etching process comprising carbon tetrafluoromethane ($CF_4$) with the addition of oxygen ($O_2$), for example. The added $O_2$ may induce oxidation at the surface of the bulk substrate layer 106 such that the decrease in the etch rate of bulk substrate layer 106 occurs. Accordingly, the first etching process may etch the hardmask layer 108 while being selective to the underlying bulk substrate layer 106, the first oxide elements 110' and the second oxide elements 126'. The second etching process may include a dry etching process that consists of carbon tetrafluoromethane ($CF_4$), for example. In this regard, the first oxide elements 110' and the second oxide elements 126' may be utilized to pattern the bulk substrate layer 106. Various other etching processes, however, may be used to extend the voids 130' through the hardmask layer 108 and into the bulk substrate layer 106 as understood by those ordinarily skilled in the art.

As further illustrated in FIG. 14, one or more hetero semiconductor elements 132 (e.g., hetero fins 132) are formed on the bulk substrate layer 106 of the pFET region 104, and one or more non-hetero semiconductor elements 134 (e.g., non-hetero fins 134) are formed on the bulk substrate layer 106 of the nFET region 102. As described above, the hetero fins 132 may comprise SiGe, for example, and the non-hetero fins 134 may comprise Si, for example. Accordingly, at least one exemplary embodiment provides hetero fins 132 that increase electrical hole mobility therethrough.

The width of the hetero fins 132 are based on the width of the hetero material, e.g., epi 124, formed in the extended cavities 118' as described above with respect to FIGS. 9-10. The width of the non-hetero fins 134 is based on a width of the first oxide elements 110' formed on the upper surface of the hardmask layer 108.

Figure 15:
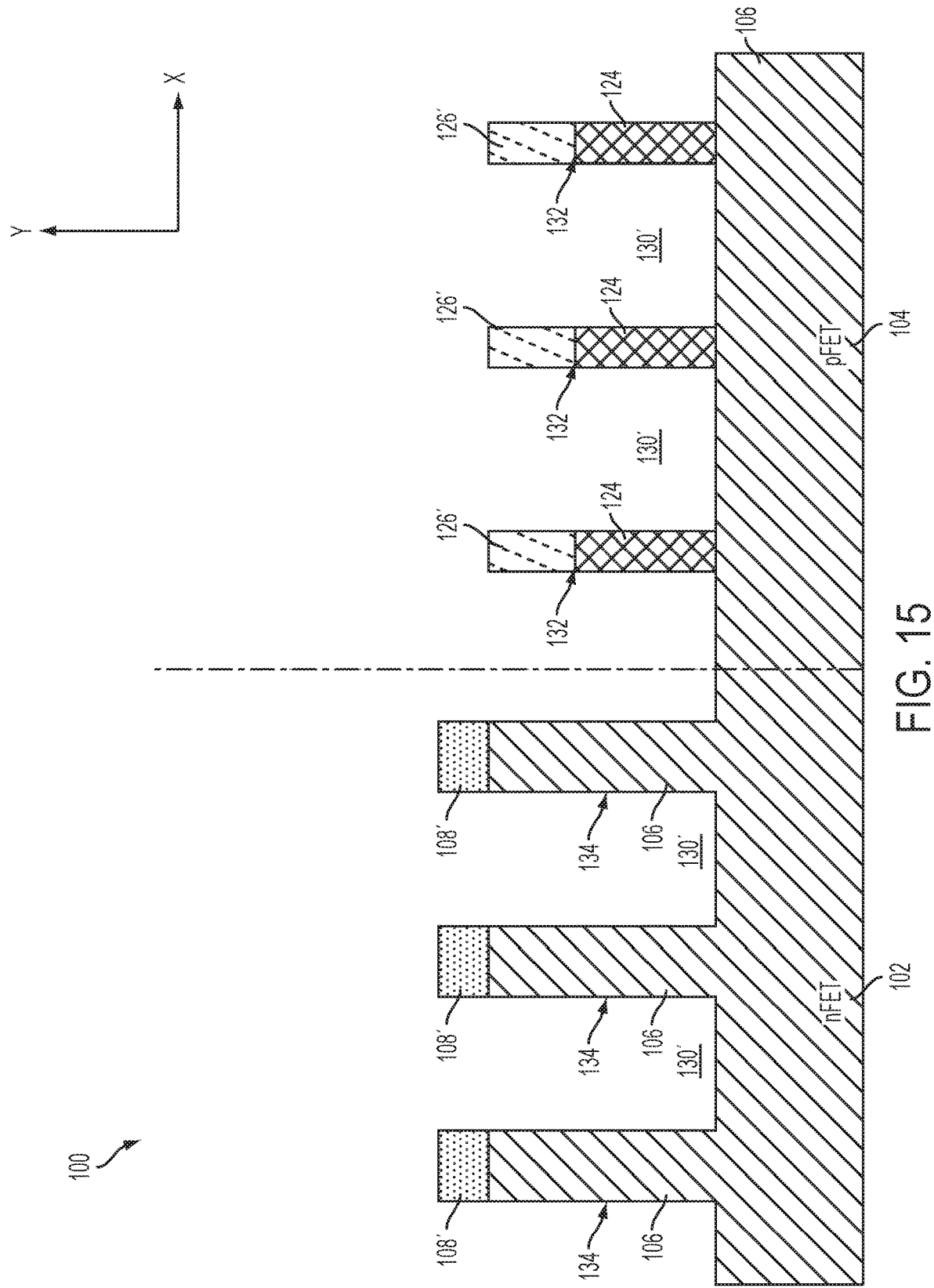
FIG. 15 illustrates the semiconductor substrate of FIG. 14 after removing remaining portions of the second oxide layer from the upper surface of the non-hetero fins.

Turning to FIG. 15, the first oxide elements 110' are recessed from the non-hetero fins 134 while stopping an upper surface of the hardmask layer 108'. Accordingly, the remaining portions of the hardmask layer 108' formed on the non-hetero fins 134 are exposed, while a portion of the second oxide elements 126' formed on an upper surface of the hetero fins 132 is recessed. Various dry etching processes that are selective to the bulk substrate layer 106, the hetero fins 132, and the non-hetero fins 134 may be used to recess the first oxide elements 110'.

Figure 16:
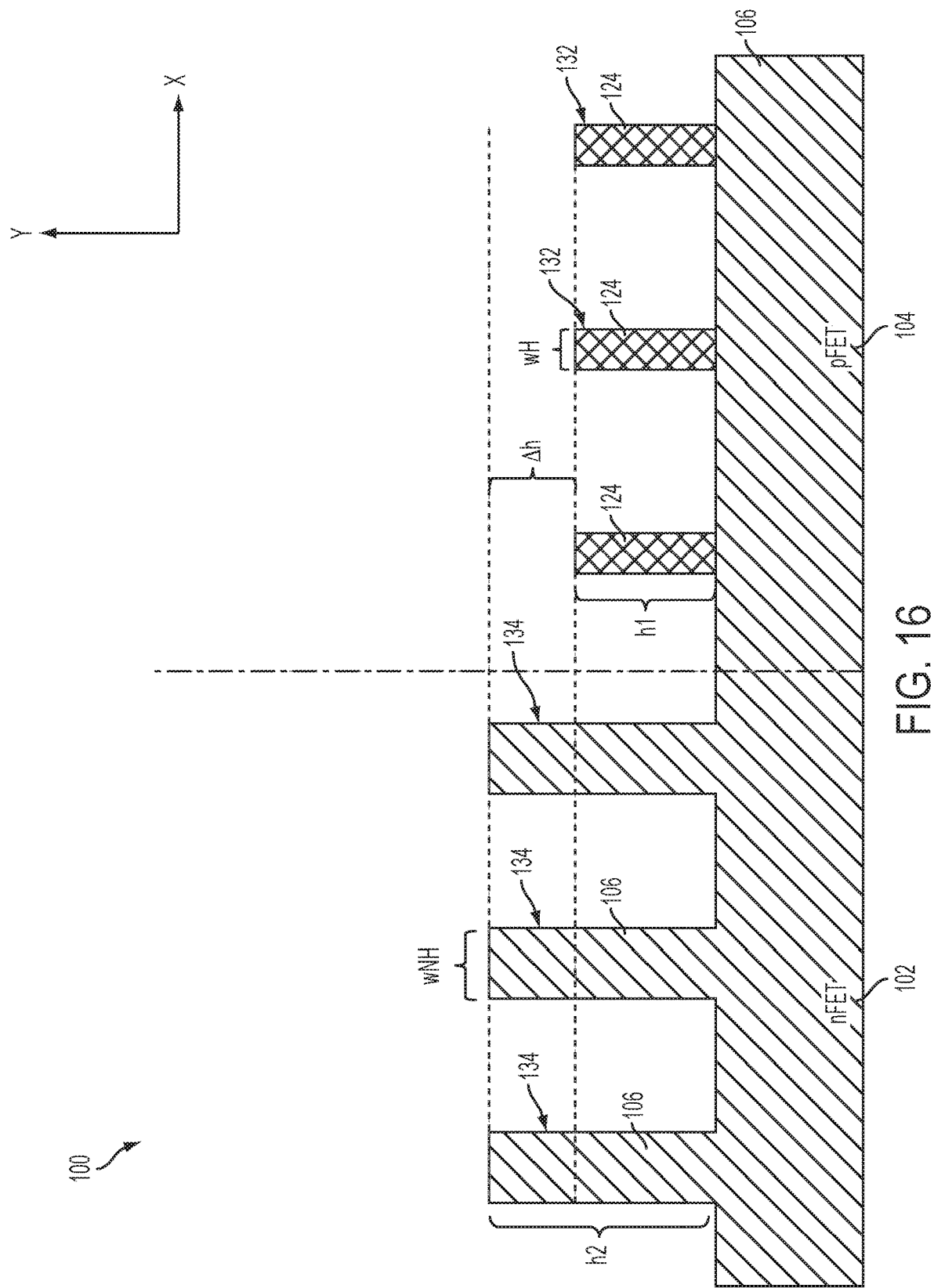
FIG. 16 illustrates the semiconductor substrate of FIG. 15 after removing remaining portions of the second oxide layer from the upper surface of the hetero fins to define a plurality of hetero fins having a first height and first width and after removing remaining portions of the hardmask layer from the upper surface of the non-hetero fins to define a plurality of non-hetero fins having a second height and second width.
Figure 17:
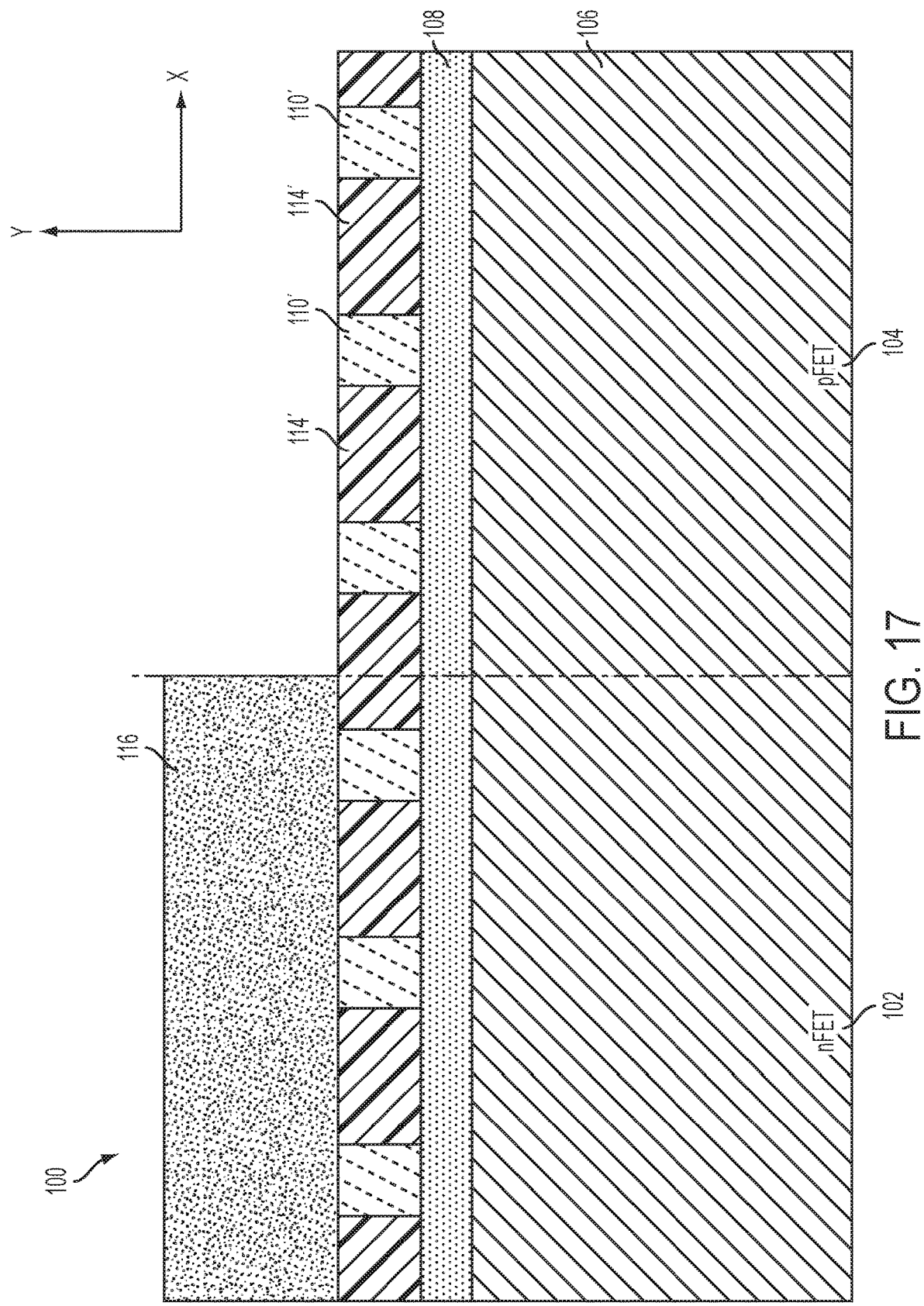
FIG. 17 illustrates a semiconductor substrate according to another embodiment following patterning of a masking layer to expose a pFET region of the semiconductor device.

Referring now to FIG. 16, the second oxide elements 126' may be removed from the hetero fins 132 and the remaining portions of the hardmask layer 108 may be removed from the non-hetero fins 134. A first dry etching process that is selective to the bulk substrate layer 106, the hardmask layer 108, the hetero fins 132, and the non-hetero fins 13, may be used to remove the second oxide elements 126'. A second dry etching process that is selective to the bulk substrate layer 106, the hetero fins 132, and the non-hetero fins 134 may be used to remove the hardmask layer 108.

As further illustrated in FIG. 16, a semiconductor device 100 is formed including both non-hetero fins 134 formed on a bulk substrate layer 106 corresponding to the nFET region 102 and hetero fins 132 formed on the bulk substrate layer 106 corresponding to the pFET region 104. It is appreciated, however, that hetero fins may be formed in the nFET region 102 and non-hetero fins may be formed in the pFET region 104. The hetero fins 132 may have an adjustable height with respect to a height of the non-hetero fins 134. For example, the hetero fins 132 may have a first height ($h_1$) while the non-hetero fins 134 may have a second height ($h_2$) that is greater than the first height ($h_1$). Accordingly, a height differential ($\Delta_h$) may be defined between the non-hetero fins 134 and the hetero fins 132. It is appreciated, however, that the height of the hetero fins 132 may be greater than the height of the non-hetero fins 134.

The hetero fins 132 may also have an adjustable width with respect to a width of the non-hetero fins 134. For example, the hetero fins 132 may have a first width ($w_H$) while the non-hetero fins 134 may have a second width ($w_{NH}$) that is greater than the first width ($w_H$). It is appreciated, however, that the width of the hetero fins 132 may be greater than the width of the non-hetero fins 134. Accordingly, an adjustable width ratio between the width ($w_{NH}$) of the non-hetero fins 134 and the width ($w_H$) of the hetero fins 132 may be defined. In this regard, the current output of a pFET may be tuned (i.e., may have a different current output) with respect to the current output of an nFET. According to one exemplary embodiment, a pFET including hetero semiconductor fins and an nFET including non-hetero semiconductor fins may form pull-up/pull-down transistors configured to perform write/read operations more quickly for SRAM applications.

Turning now to FIGS. 17-24, a process flow for fabricating a semiconductor device 100 is illustrated according to another exemplary embodiment. With regards to FIG. 17, the starting semiconductor substrate 100 includes a bulk substrate layer 106 and a hardmask layer 108 formed on an upper surface of the bulk substrate layer 106 (similar to the point of processing as shown in FIG. 5 of the first embodiment). Although the semiconductor substrate 100 is illustrated as bulk semiconductor substrate, it is appreciated that the semiconductor substrate 100 may be formed as an SOI substrate as understood by those ordinarily skilled in the art. An alternating series of oxide elements 110' and high-k elements 114' are formed on an upper surface of the hardmask layer 108 as described in detail above. The semiconductor substrate 100 is further illustrated following patterning of masking layer 106 to expose a pFET region 104 of the semiconductor substrate 100.

Figure 18:
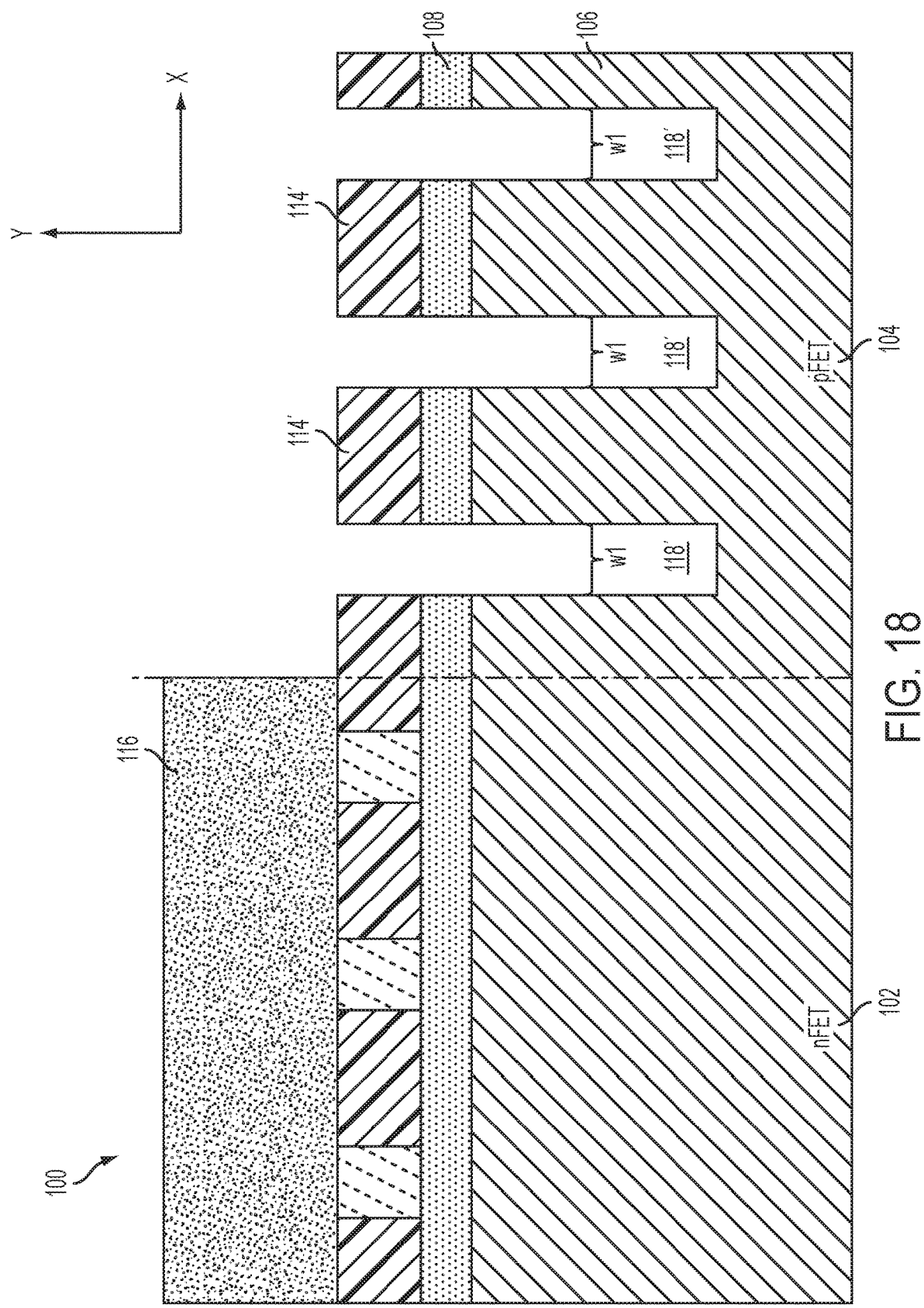
FIG. 18 illustrates the semiconductor substrate of FIG. 17 following removal of the first oxide layer and after forming cavities that extend into a bulk substrate layer of the semiconductor substrate.

Referring to FIG. 18, first oxide elements corresponding to the pFET region 104 are removed and extended cavities 118' are formed between the high-k elements 114'. The depth of the cavities 118' extend through the hardmask layer 108 and into the bulk substrate layer 106 as described in detail above. The extended cavities 118' have an initial width ($w_1$).

Figure 19:
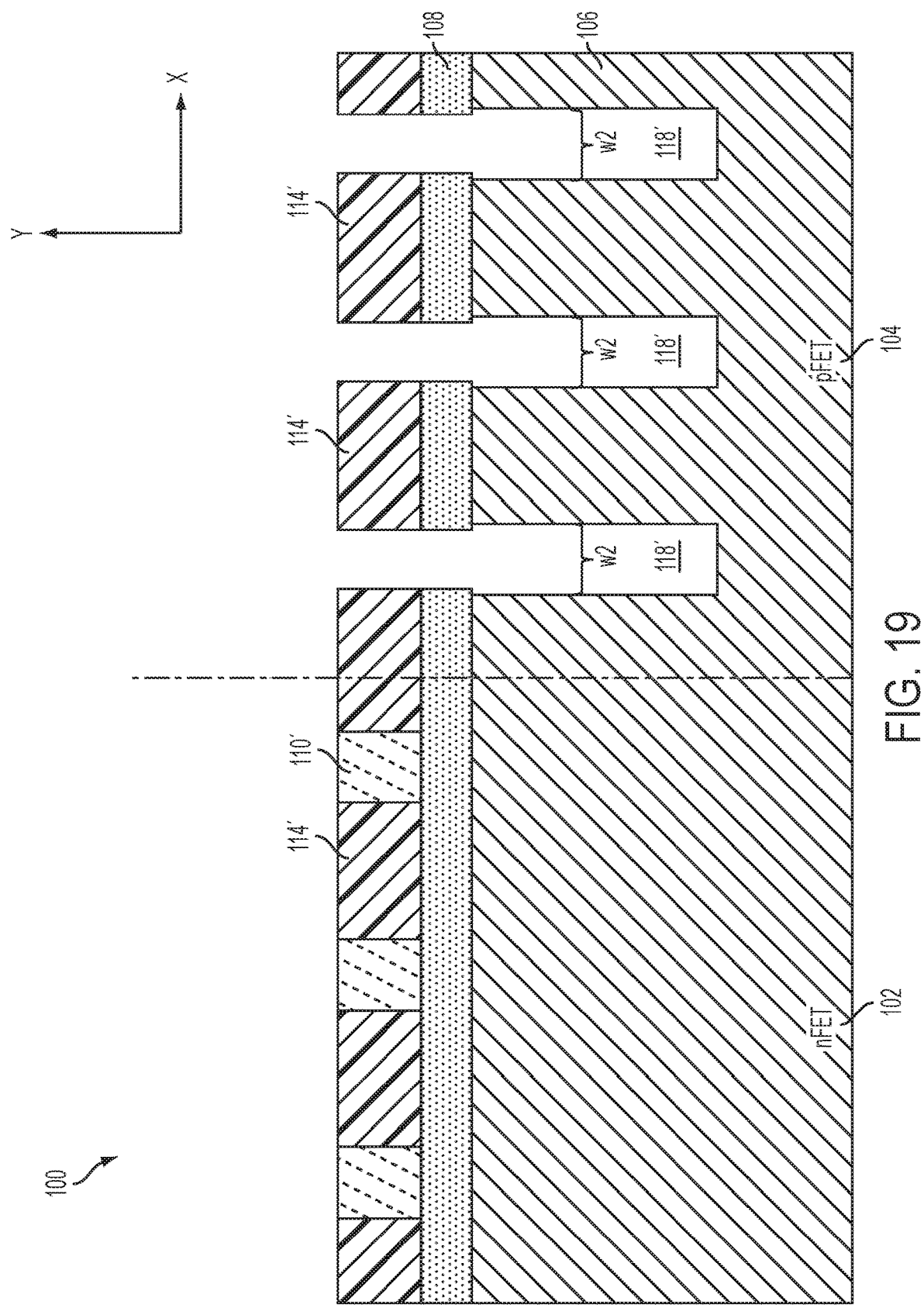
FIG. 19 illustrates the semiconductor substrate of FIG. 18 following an etching process to increase the width of the cavities.

Turning to FIG. 19, the extended cavities 118' are etched laterally (i.e., perpendicular to the direction of the depth) such that the width of the cavities 118' is increased to define a second width ($w_2$). After increasing the width of the cavities 118', the remaining portion of the masking layer 116 is removed from the nFET region 102 of the semiconductor substrate 100. A dry etching process that consists of carbon tetrafluoromethane ($CF_4$), for example, may be used to increase the width of the cavities 118' and enlarge the space in which epitaxial material may be grown. Accordingly, the growth rate of epitaxial material grown on the sides of the cavities 118' may be reduced to improve the uniformity at which an epi material may be grown.

Figure 20:
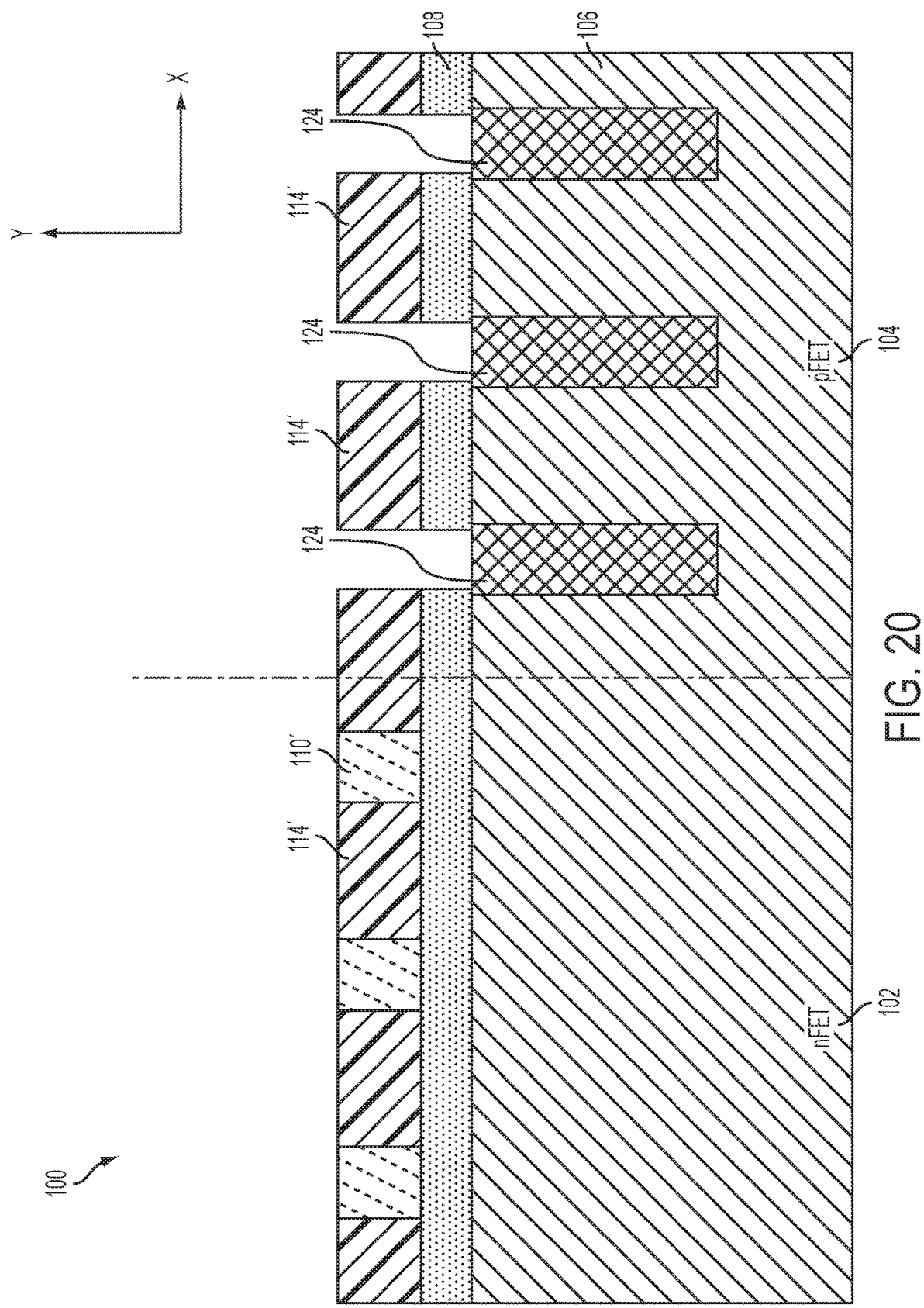
FIG. 20 illustrates the semiconductor substrate of FIG. 19 following an epitaxial growth process to grow epitaxial material in the cavities.

Turning to FIG. 20, an epitaxial material (epi) 124 is grown on the surfaces of the substrate layer 106 exposed by the extended cavities 118'. According to one exemplary embodiment, the epi 124 comprises silicon germanium (SiGe). The SiGe in this case, for example, forms a respective hetero semiconductor element (i.e., hetero fin) corresponding to the pFET region 104 as discussed in greater detail below. The height of the epi 124 may be controlled according to the amount epi 124 grown within the extended cavities 118'.

Figure 21:
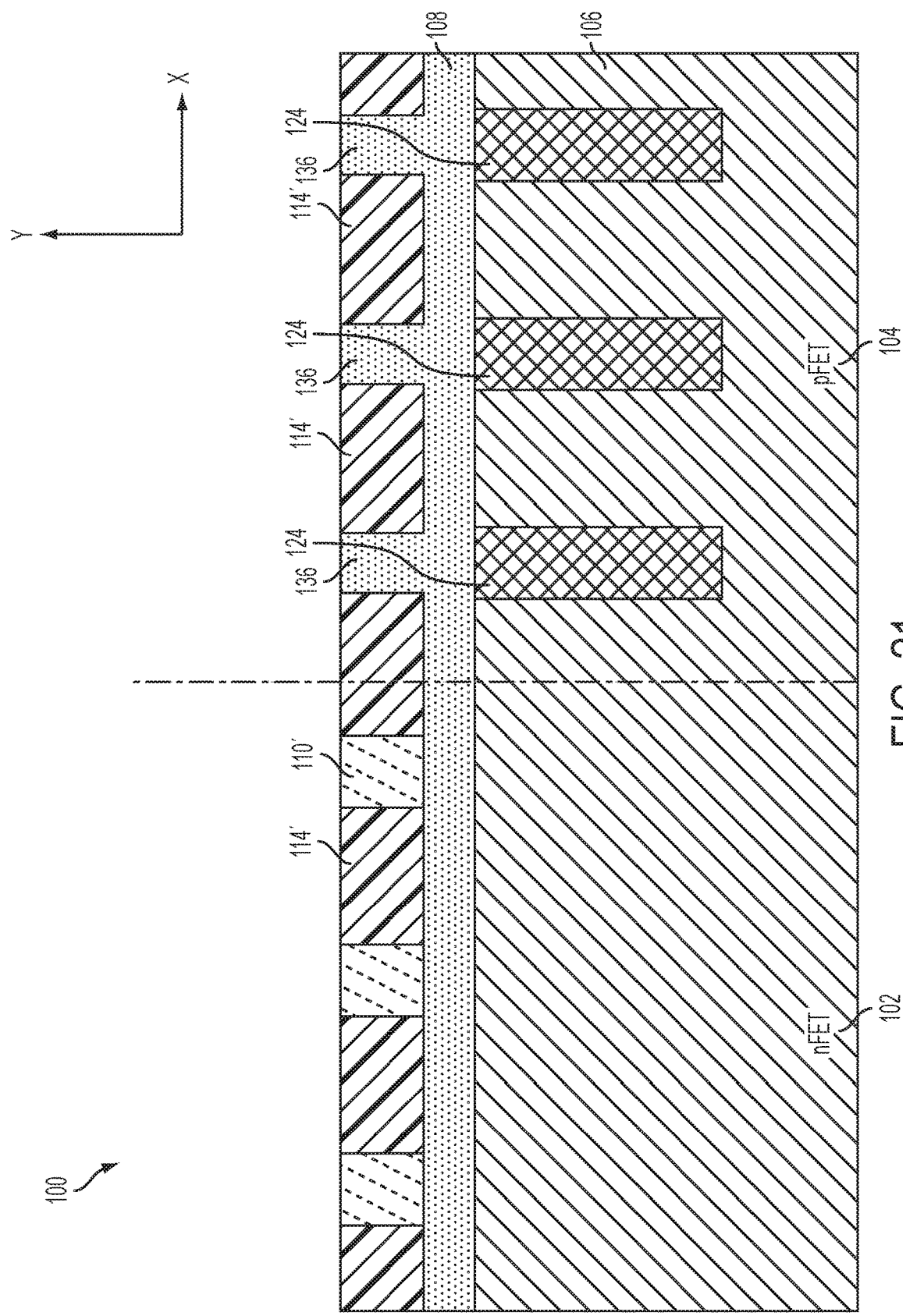
FIG. 21 illustrates the semiconductor substrate of FIG. 20 following deposition of a hardmask layer in the cavities and on an upper surface of the epitaxial material.

Turning to FIG. 21, a hardmask material is deposited on an upper surface of the epi 124 to fill the remaining space defined by cavities 118'. The hardmask material may be recessed to form hardmask elements 136 having an upper surface that is flush with an upper surface of the high-k elements 114' corresponding to the pFET region 104. Accordingly to at least one exemplary embodiment, the material of the hardmask elements 136 matches the material of the hardmask layer 108.

Figure 22:
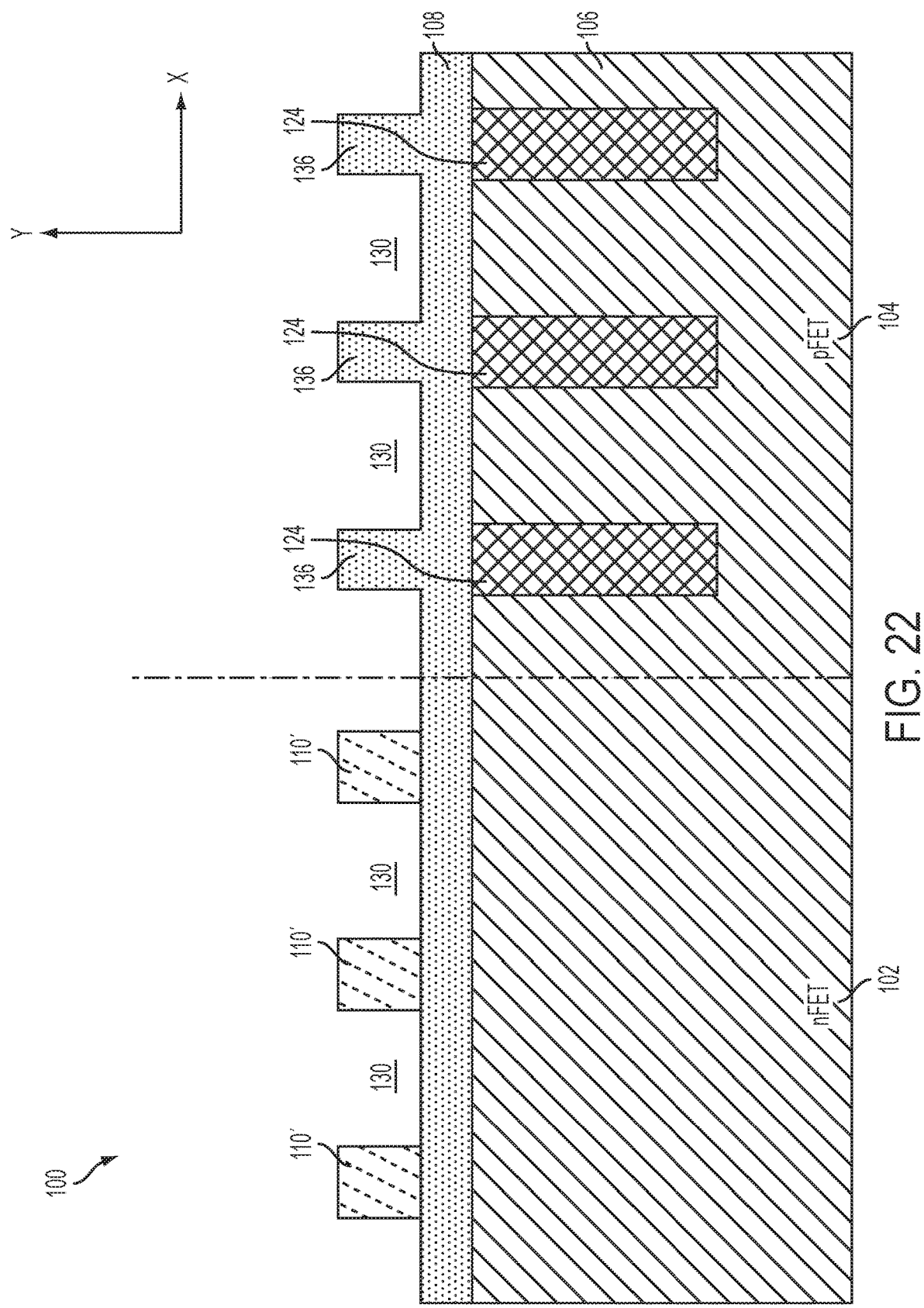
FIG. 22 illustrates the semiconductor substrate of FIG. 21 following removal of high-k elements from the upper surface of the semiconductor device to form a plurality of voids.

Turning to FIG. 22, the high-k elements 114' corresponding to the nFET region 102 and the pFET region 104 are removed. Accordingly, voids 130 are formed between pairs of first oxide elements 110' and also between pairs of hardmask elements 136. Various etching process may be used to remove the high-k elements 114'. For example, a wet etching process comprising a combination of hydrochloric acid (HCl) and sulfuric acid ($H_2SO_4$) may etch away the high-k elements 114' while being selective to the hardmask layer 108, the first oxide elements 110', and the hardmask elements 136.

Figure 23:
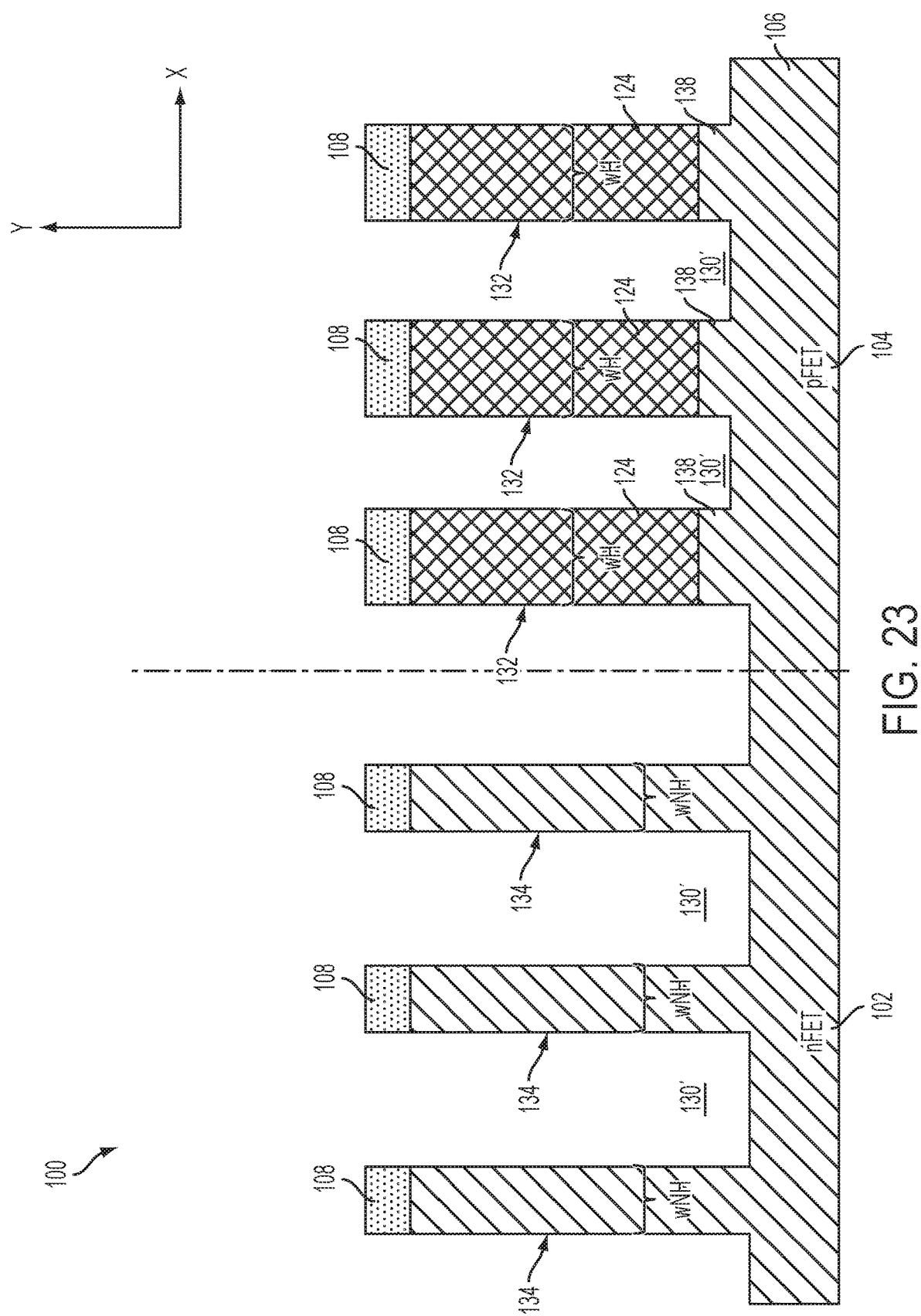
FIG. 23 illustrates the semiconductor substrate of FIG. 22 following an etching process that extends the voids into the bulk substrate layer to form a plurality of non-hetero fins at the nFET region and a plurality of hetero fins at the pFET region.

Turning to FIG. 23, extended voids 130' are formed through the hardmask layer 108 and into the bulk substrate layer 106. Accordingly, a plurality of hetero fins 132 are formed in the pFET region 104 and a plurality of non-hetero fins 134 are formed in the nFET region 102. The oxide elements 110' may be removed after forming the extended voids 130'.

The extended voids 130' may be formed using a two-step etching process. A first etching process may be used to etch the hardmask layer 108 exposed by a respective void 130, and recess the hardmask elements formed on the hetero fins 132. A second etching process may be used to etch the bulk substrate layer 106 and extend the voids 130' therethrough. The first etching process may include a dry etching process comprising carbon tetrafluoromethane ($CF_4$) with the addition of oxygen ($O_2$), for example. The added $O_2$ may induce oxidation at the surface of the bulk substrate layer 106 such that a decrease in the etch rate of bulk substrate layer occurs 106. The first etching process may etch the hardmask layer 108 while being selective to the underlying bulk substrate layer 106. The second etching process may include a dry etching process that consists of carbon tetrafluoromethane ($CF_4$), for example. Various other etching processes, however, may be used to extend the voids 130' through the hardmask layer 108 and into the bulk substrate layer 106 as understood by those ordinarily skilled in the art.

Still referring to FIG. 23, at least one exemplary embodiment includes an excess substrate portion 138 that is formed between the hetero fins 132 and the bulk substrate layer 106. The excess substrate portion 138 may provide an over-etch tolerance when forming the extended voids 130'. Accordingly, an entire portion of the epi 124 may be exposed such that the epi 124 may be maintained during a gate stack formation process.

Figure 24:
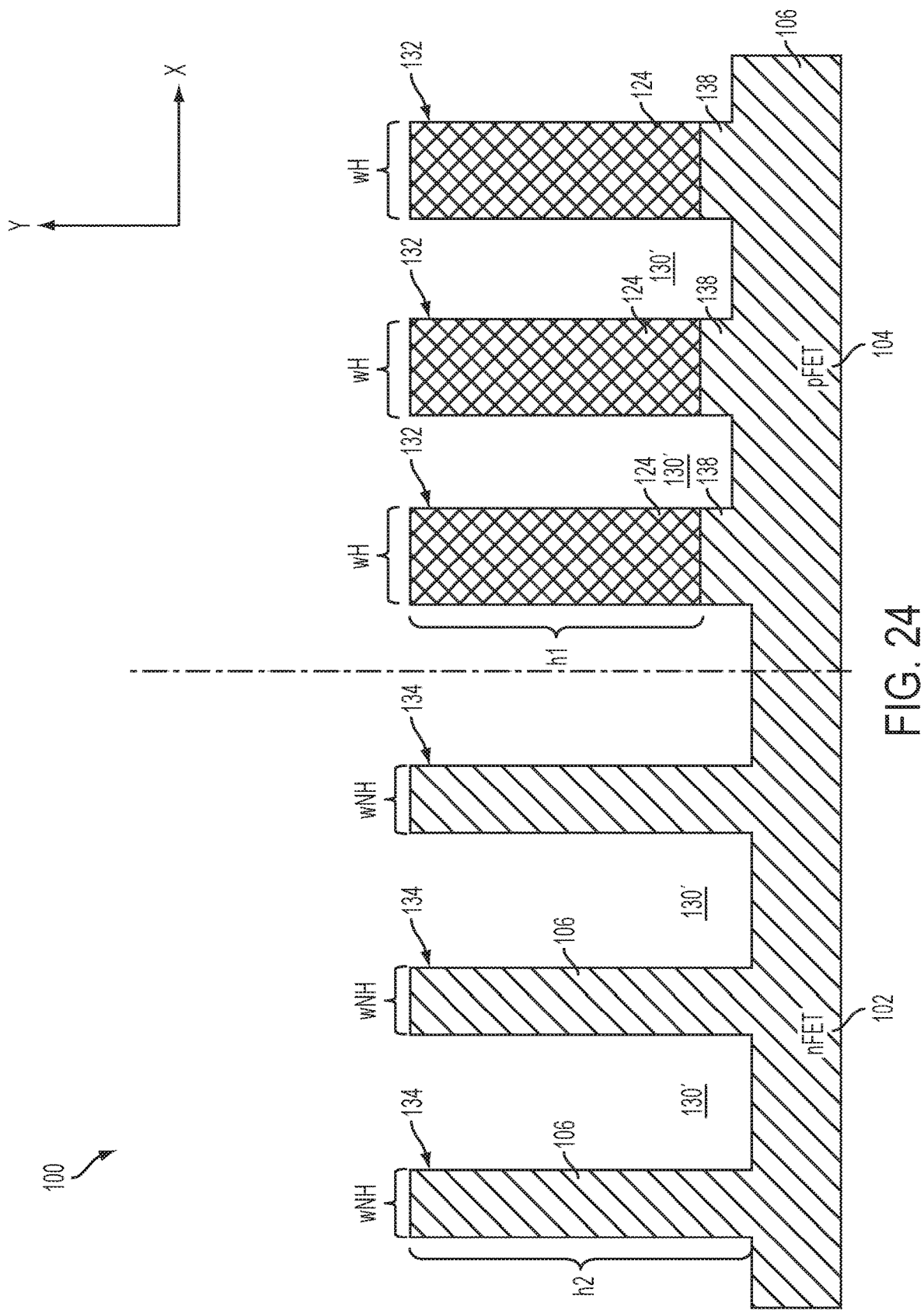
FIG. 24 illustrates the semiconductor substrate of FIG. 23 after removing remaining portions of a hardmask layer from the upper surface of the hetero fins and non-hetero fins to define a plurality of hetero fins having a first height and first width and a plurality of non-hetero fins having a second height and second width.

Referring to FIG. 24, the remaining portions of the hardmask layer 108 are removed from the hetero fins 132 and the non-hetero fins 134. Although hetero fins 132 are formed in the pFET region 104 and non-hetero fins 134 are formed in the nFET region 102, it is appreciated that the hetero fins 132 may be formed in the nFET region 102 and the non-hetero fins 134 may be formed in the pFET region 104. As described above, the hetero fins 132 may be formed of SiGe, for example, and the non-hetero fins 134 may be formed from Si, for example. Accordingly, at least one exemplary embodiment provides hetero fins 132 that increase electrical hole mobility therethrough.

The width ($w_H$) of the hetero fins 132 are based on the width of the hetero material, e.g., SiGe epi 124, formed in the extended cavities 130' as described above with respect to FIGS. 9-10. The width of the non-hetero fins 134 are based on a width of the first oxide elements 110' formed on the upper surface of the hardmask layer 108 as described in detail above.

The hetero fins 132 may also have an adjustable height with respect to a height of the non-hetero fins 134 as further illustrated in FIG. 24. For example, the hetero fins 132 may have a first height ($h_1$) that extends between an upper surface of the epi 124 and an upper surface of the excess substrate portion 138. The non-hetero fins 134 may have a second height ($h_2$) that extends between an upper surface of the non-hetero fin 134 and the base of the bulk substrate layer 106. The second height ($h_2$) of the non-hetero fins 134 may be greater than the first height ($h_1$) of the hetero fins 132. Accordingly, a height differential ($\Delta_h$) may be defined between the non-hetero fins 134 and the hetero fins 132. It is appreciated, however, that the height of the hetero fins 132 may be greater than the height of the non-hetero fins 134.

Figure 25:
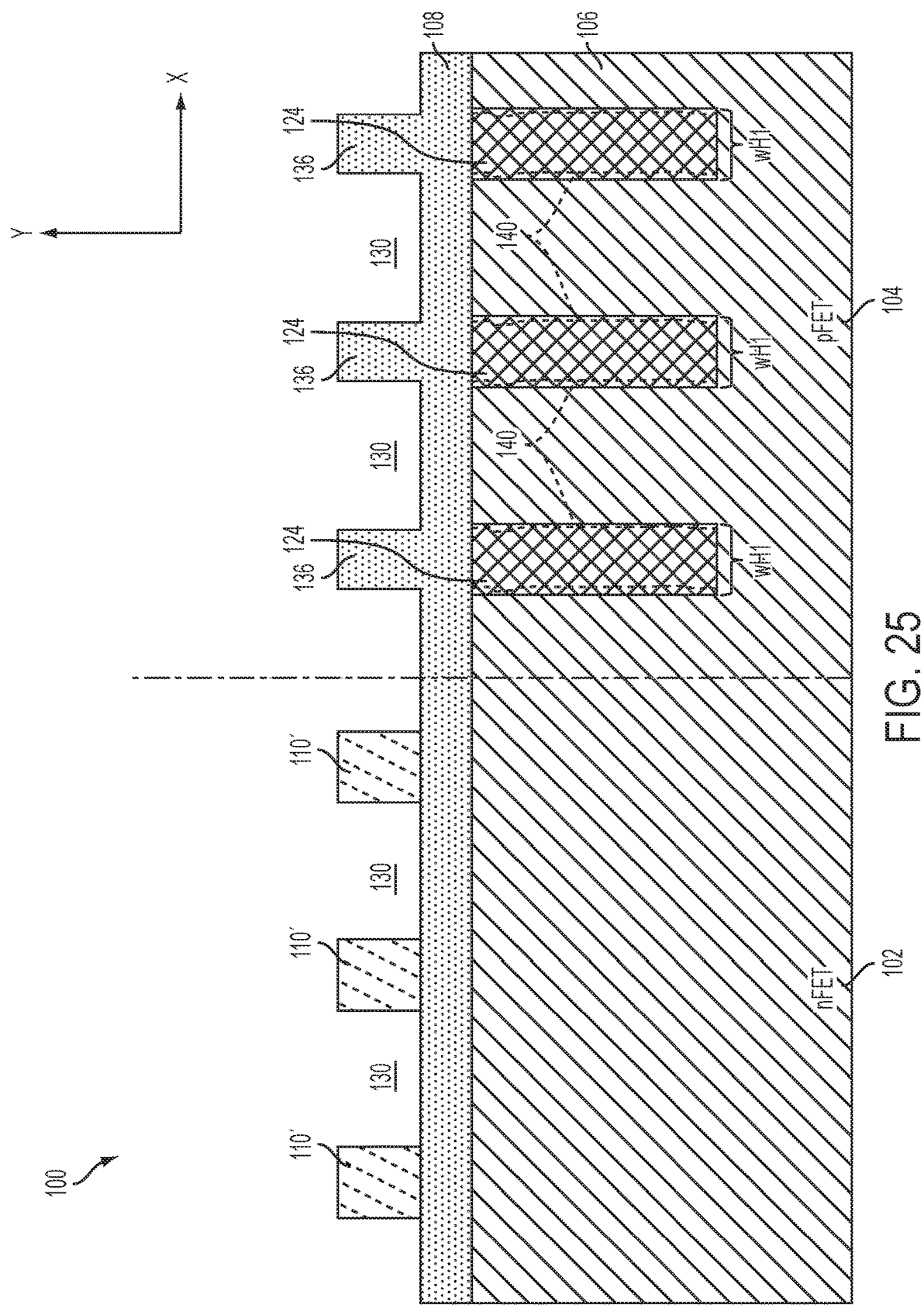
FIG. 25 illustrates a semiconductor substrate including a epitaxial material having a first width grown in a plurality of cavities formed in a bulk substrate layer corresponding to a pFET region of the semiconductor substrate according to another embodiment.
Figure 26:
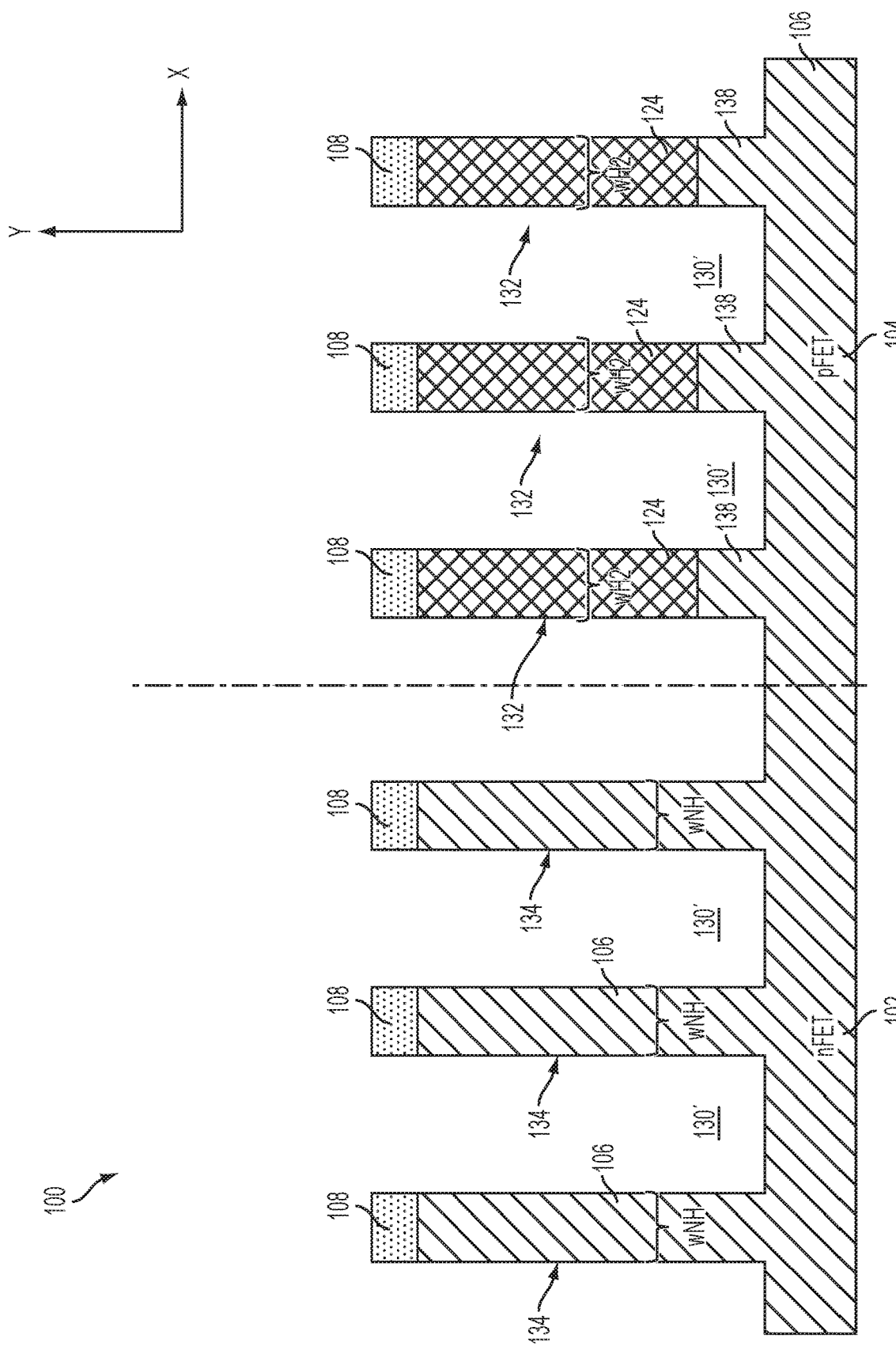
FIG. 26 illustrates the semiconductor substrate of FIG. 25 following an etching process that forms a plurality of voids in the bulk substrate layer and that trims sidewall portions of the epitaxial material.
Figure 27:
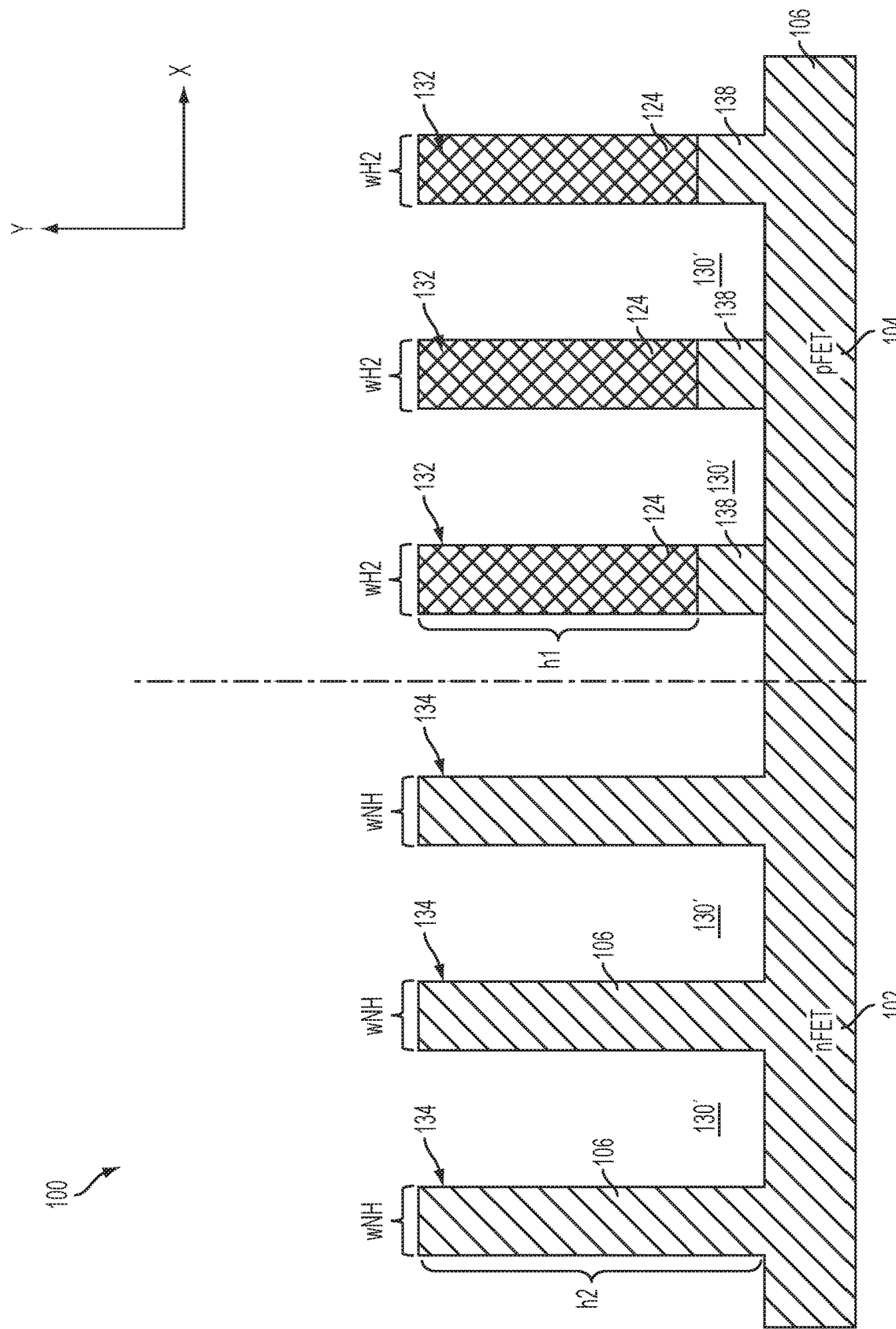
FIG. 27 illustrates the semiconductor substrate of FIG. 26 after removing remaining portions of a hardmask layer from the upper surface of the non-hetero fins and the hetero fins to define a plurality of hetero fins with trimmed sidewalls having a first height and a plurality of non-hetero fins having a second height.

Turning now to FIGS. 25-27, a process flow for fabricating a semiconductor device is illustrated according to another exemplary embodiment. Referring to FIG. 25, a starting semiconductor substrate 100 includes a bulk substrate layer 106 and a hardmask layer 108 formed on an upper surface of the bulk substrate layer 106. Although the semiconductor substrate 100 is illustrated as bulk semiconductor substrate, it is appreciated that the semiconductor substrate 100 may be formed as an SOI substrate as understood by those ordinarily skilled in the art. A plurality of oxide elements 110' are formed on an upper surface of the hardmask layer 108 corresponding to the nFET region 102. With respect to the pFET region 104, a plurality of hardmask elements 136 are formed on an upper surface of epi grown material (epi) 124. The epi 124 has an initial width ($w_{H1}$). During the epi growth process, damaged portions 140 may form on the sidewalls of the epi 124. Initial voids 130 are formed between pairs of the oxide elements 110' and the hardmask elements 136. The oxide elements 110', hardmask elements 136, the epi grown material 124, and the initial voids 130 may be formed according to the various operations described in detail above.

Referring to FIG. 26, the oxide elements 110' are removed and the depth of the initial voids may be extended through the hardmask layer 108 and into the bulk substrate layer 106. According to at least one exemplary embodiment, sidewalls of the epi 124 may be trimmed as a result of forming the extended voids 130' into the bulk substrate layer 106. In this regard, the damaged portions 140 may be removed and the width of the epi 124 may be reduced to define a second width ($w_{H2}$). The second width ($w_{H2}$) of the hetero fins 132 may be equal or approximately equal to the width ($w_{NH}$) of the non-hetero fins 134, for example, or may have a different width with respect to the width of the non-hetero fins 134.

Turning to FIG. 27, the remaining portion of the hardmask layer 108 and/or the hardmask elements 136 are removed from the upper surface of the hetero fins 132 and the non-hetero fins 134. Accordingly, a semiconductor device 100 including both non-hetero fins 134 and hetero fins 132 excluding damaged epi sidewall portions may be provided. The hetero fins 132 may also have an adjustable height with respect to a height of the non-hetero fins 134 as further illustrated in FIG. 27. For example, the hetero fins 132 may have a first height ($h_1$) that extends between an upper surface of the epi 124 and an upper surface of the excess substrate portion 138. The non-hetero fins 134 may have a second height ($h_2$) that extends between an upper surface of the non-hetero fin 134 and the base of the bulk substrate layer 106. The second height ($h_2$) of the non-hetero fins 134 may be greater than the first height ($h_1$) of the hetero fins 132. Accordingly, a height differential ($\Delta_h$) may be defined between the non-hetero fins 134 and the hetero fins 132. It is appreciated, however, that the height of the hetero fins 132 may be greater than the height of the non-hetero fins 134.

The terminology used herein is for the purpose of describing exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A semiconductor device, comprising:
   a semiconductor substrate including a bulk substrate layer that extends along a first axis to define a width and a second axis perpendicular to the first axis to define a height;
   at least one excess portion on a first region of the bulk substrate layer, the at least one excess portion including an upper surface having a width;
   at least one hetero semiconductor fin including an epitaxial material on the upper surface of the at least one excess portion, the at least one hetero semiconductor fin having a first fin width matching the width of the excess portion; and
   at least one non-hetero semiconductor fin on a second region of the bulk substrate layer different from the first region, the at least one non-hetero semiconductor fin having a second fin width that is less than the first fin width and the first width of the excess portion.

2. The semiconductor device of claim 1, wherein the at least one non-hetero semiconductor fin is integral with the bulk substrate layer.

3. The semiconductor device of claim 2, wherein the at least one excess substrate portion is between the at least one hetero semiconductor fin and the bulk substrate layer.

4. The semiconductor device of claim 3, wherein the material of the at least one non-hetero semiconductor fin is different from the epitaxial material.

5. The semiconductor device of claim 4, wherein the material of the at least one non-hetero semiconductor fin, the bulk substrate, and the excess substrate portion is silicon (Si).

6. The semiconductor device of claim 5, wherein the epitaxial material is silicon germanium (SiGe).

7. The semiconductor device of claim 3, wherein the at least one hetero semiconductor fin has a first height defined by a height of the epitaxial material and the at least one non-hetero semiconductor fin has a second height that is different than the first height.

8. The semiconductor device of claim 7, wherein the second height of the at least one non-hetero semiconductor fin is greater than the first height of the at least one hetero semiconductor fin.

9. The semiconductor device of claim 8, wherein the epitaxial material of the at least one hetero semiconductor fin consists of silicon germanium (SiGe) to define a p-type field effect transistor.

10. The semiconductor device of claim 9, wherein the at least one non-hetero semiconductor fin consists of silicon (Si) to define an n-type field effect transistor.

11. A method of fabricating a semiconductor device, the method comprising:
    forming at least one excess portion on a first region of a bulk substrate layer, the at least one excess portion including an upper surface having a width;
    forming at least one hetero semiconductor fin including an epitaxial material on the upper surface of the at least one excess portion such that the at least one hetero semiconductor fin has a first fin width matching the width of the excess portion; and
    forming at least one non-hetero semiconductor fin on a second region of the bulk substrate layer different from the first region, the at least one non-hetero semiconductor fin having a second fin width that is less than the first fin width and the first width of the excess portion.

12. The method of claim 11, wherein the at least one non-hetero semiconductor fin is formed integral with the bulk substrate layer.

13. The method of claim 12, wherein the at least one excess substrate portion is formed between the at least one hetero semiconductor fin and the bulk substrate layer.

14. The method of claim 13, wherein the material of the at least one non-hetero semiconductor fin is different from the epitaxial material.

15. The method of claim 14, wherein the material of the at least one non-hetero semiconductor fin, the bulk substrate, and the excess substrate portion is silicon (Si).

16. The method of claim 15, wherein the epitaxial material is silicon germanium (SiGe).

17. The method of claim 13, wherein the at least one hetero semiconductor fin has a first height defined by a height of the epitaxial material and the at least one non-hetero semiconductor fin has a second height that is different than the first height.

18. The method of claim 17, wherein the second height of the at least one non-hetero semiconductor fin is greater than the first height of the at least one hetero semiconductor fin.

19. The method of claim 18, wherein the epitaxial material of the at least one hetero semiconductor fin consists of silicon germanium (SiGe) to define a p-type field effect transistor.

20. The method of claim 19, wherein the at least one non-hetero semiconductor fin consists of silicon (Si) to define an n-type field effect transistor.

* * * * *